US010469243B2

(12) United States Patent
Ittogi et al.

(10) Patent No.: US 10,469,243 B2
(45) Date of Patent: Nov. 5, 2019

(54) COMMUNICATION APPARATUS, REPLACEMENT UNIT, AND IMAGE FORMING APPARATUS

(71) Applicant: CANON KABUSHIKI KAISHA, Tokyo (JP)

(72) Inventors: Hirotaka Ittogi, Yokohama (JP); Ichiro Iijima, Susono (JP); Kenjiro Hori, Tokorozawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/961,005

(22) Filed: Apr. 24, 2018

(65) Prior Publication Data

US 2018/0316485 A1    Nov. 1, 2018

(30) Foreign Application Priority Data

May 1, 2017    (JP) .................................. 2017-091396
May 1, 2017    (JP) .................................. 2017-091397

(51) Int. Cl.
| | |
|---|---|
| *H04B 3/46* | (2015.01) |
| *H04L 7/00* | (2006.01) |
| *H04B 17/21* | (2015.01) |
| *H04L 7/06* | (2006.01) |
| *H04L 5/16* | (2006.01) |
| *H04L 25/49* | (2006.01) |
| *H03K 7/08* | (2006.01) |

(52) U.S. Cl.
CPC ........... *H04L 7/0087* (2013.01); *H04B 17/21* (2015.01); *H04L 5/16* (2013.01); *H04L 7/06* (2013.01); *H04L 25/4902* (2013.01); *H03K 7/08* (2013.01)

(58) Field of Classification Search
CPC . H04L 1/20; H04L 1/24; H04L 25/061; H04L 25/4902; H04B 3/46
USPC .......................... 375/224, 316; 327/333, 543
See application file for complete search history.

(56) References Cited

U.S. PATENT DOCUMENTS

| | | | | |
|---|---|---|---|---|
| 5,621,758 A | * | 4/1997 | Suzuki | .................... H03M 5/08 327/31 |
| 9,088,473 B2 | | 7/2015 | Karino | |
| 2004/0068737 A1 | * | 4/2004 | Itoh | ........................ H04H 60/39 725/14 |

(Continued)

FOREIGN PATENT DOCUMENTS

| | | |
|---|---|---|
| JP | 4393351 B2 | 1/2010 |
| JP | 2014-121015 A | 6/2014 |

*Primary Examiner* — Khai Tran
(74) *Attorney, Agent, or Firm* — Venable LLP

(57) ABSTRACT

A communication apparatus includes a first terminal that receives a reference voltage, a second terminal that receives a pulse signal, and at least one processor to execute instructions. The instructions are executed to generate a clock signal that has a frequency higher than a frequency of the received pulse signal, count a number of pulses of the clock signal and determine a count value counted during a first cycle that is a cycle of the pulse signal to the second terminal, and, during a period of data transmission, increase or decrease an electric current that flows between the communication apparatus and the external apparatus according to a data value of data to be transmitted to the external apparatus. Data is transmitted to the external apparatus at least once during the first cycle, and data switch timing during the first cycle is based on the count value.

29 Claims, 20 Drawing Sheets

(56) References Cited

U.S. PATENT DOCUMENTS

2010/0195784 A1\* 8/2010 Hirata ...................... H02P 6/06
377/2

\* cited by examiner

COMMUNICATION APPARATUS, REPLACEMENT UNIT, AND IMAGE FORMING APPARATUS

BACKGROUND OF THE INVENTION

Field of the Invention

The present invention relates to a data communication technique.

Description of the Related Art

In order to perform bidirectional communication between a control apparatus that serves as a master and a data processing apparatus that serves as a slave, for example, a two-wire communication interface is used. Japanese Patent No. 4393351 and Japanese Patent Laid-Open No. 2014-121015 disclose communication systems that perform communication by using a two-wire communication interface, wherein data transmission and reception, power supply, and supply of synchronization signals are performed using two signal lines. In the configuration disclosed in Japanese Patent No. 4393351, the control apparatus outputs a pulse signal to a first terminal and a reference voltage to a second terminal. Here, power is supplied from the control apparatus to the data processing apparatus by using a voltage difference between the first terminal and the second terminal. Also, the pulse signal is a synchronization signal, and the data processing apparatus generates a synchronization timing based on the pulse signal. Furthermore, the control apparatus transmits data "0" and data "1" based on the duty ratio of the pulse signal, and the data processing apparatus transmits data "0" and data "1" based on the level of electric current that flows between the terminals. In order to increase the communication speed in the configuration disclosed in Japanese Patent No. 4393351, it is necessary to increase the frequency of the pulse signal.

However, due to the characteristics of a driving circuit that generates the pulse signal, the rising edge and the falling edge of the pulse signal are rounded, and thus there is a limit to increasing the frequency of the pulse signal. Accordingly, there is a demand for increasing the transmission rate, in particular, the transmission rate from the data processing apparatus to the control apparatus, without increasing the frequency of the pulse signal.

Also, according to Japanese Patent Laid-Open No. 2014-121015, the control apparatus sets the pulse signal to a high level so as to cause the data processing apparatus to transmit data. Then, the data processing apparatus transmits data to the control apparatus by increasing or decreasing the electric current that flows through a line according to a data value while the pulse signal from the control apparatus is at a high level. The control apparatus identifies the data from the data processing apparatus at a predetermined timing relative to the rising timing of the pulse signal. Here, there is a delay time td from when the control apparatus sets the pulse signal to a high level so as to cause the data processing apparatus to transmit data to when the control apparatus receives the data transmitted by the data processing apparatus. Accordingly, the control apparatus starts reading data (data value identification) after, for example, the delay time td has passed after setting the pulse signal to a high level.

However, the delay time td varies according to the environment and individual difference between apparatuses. For this reason, the control apparatus needs to have a sufficient margin for the variation of the delay time td when reading data. This increases the time required for data communication.

SUMMARY OF THE INVENTION

According to an aspect of the present invention, a communication apparatus includes: a first terminal to which a reference voltage is input from an external apparatus; a second terminal to which a pulse signal is input from the external apparatus; a clock generating unit configured to generate a clock signal that has a frequency higher than a frequency of the pulse signal; a counting unit configured to count a number of pulses of the clock signal; an acquiring unit configured to acquire a count value counted by the counting unit during a first cycle that is a cycle of the pulse signal input to the second terminal; and a transmitting unit configured to, during a period of data transmission to the external apparatus, increase or decrease an electric current that flows between the communication apparatus and the external apparatus via the first terminal according to a data value of data to be transmitted to the external apparatus. The transmitting unit is further configured to perform switching on the data to be transmitted to the external apparatus at least once during the first cycle, and determine a data switch timing during the first cycle based on the count value.

Further features of the present invention will become apparent from the following description of exemplary embodiments with reference to the attached drawings.

DESCRIPTION OF THE EMBODIMENTS

Figure 1:
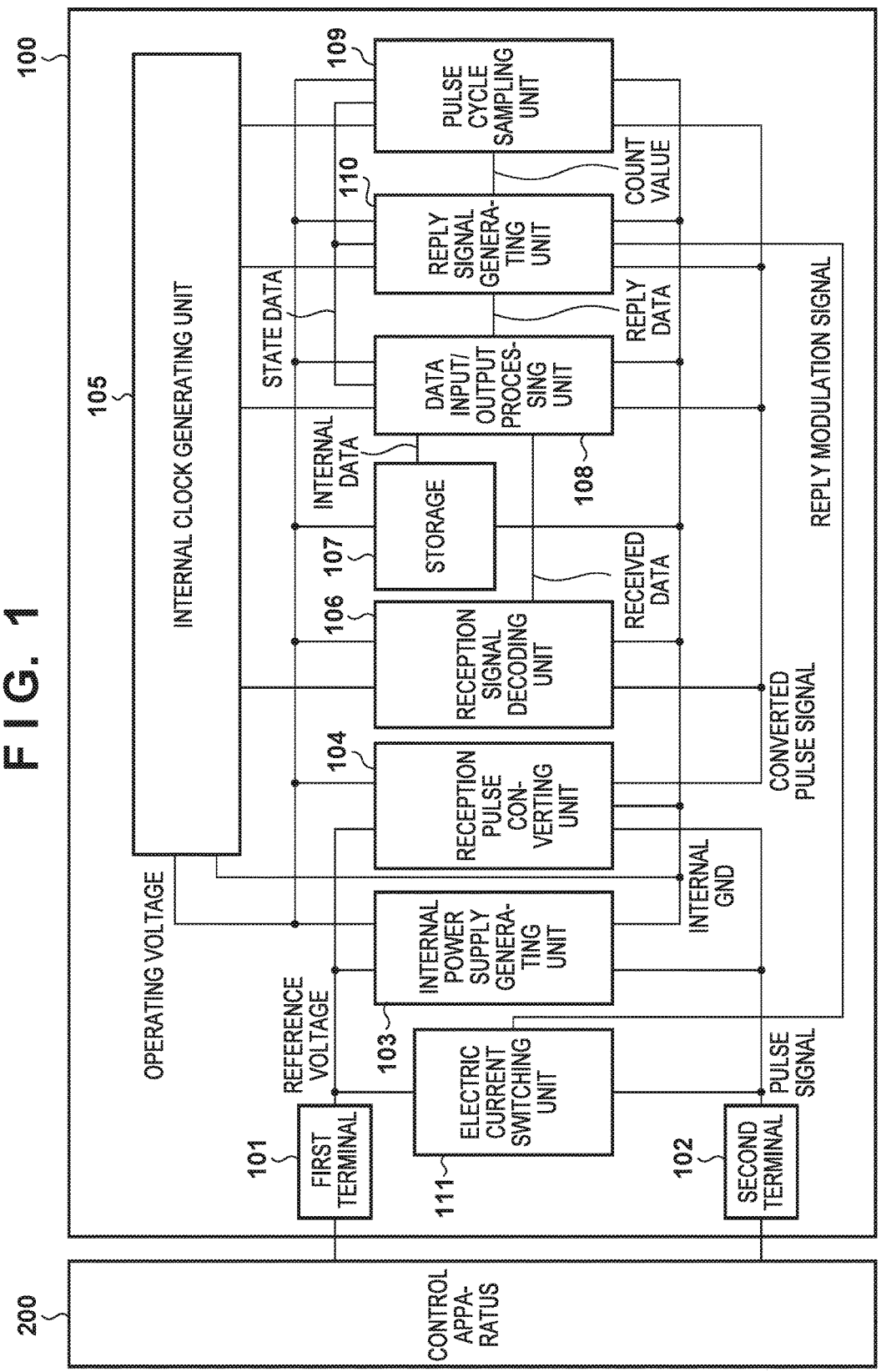
FIG. 1 is a configuration diagram of a data processing apparatus according to one embodiment.

Hereinafter, exemplary embodiments of the present invention will be described with reference to the drawings. It is to be noted that the embodiments given below are merely examples. Accordingly, the present invention is not limited to the content of the embodiments given below. Also, in the drawings mentioned below, illustration of constituent elements that are not necessary to describe the embodiments is omitted.

First Embodiment

Figure 2:
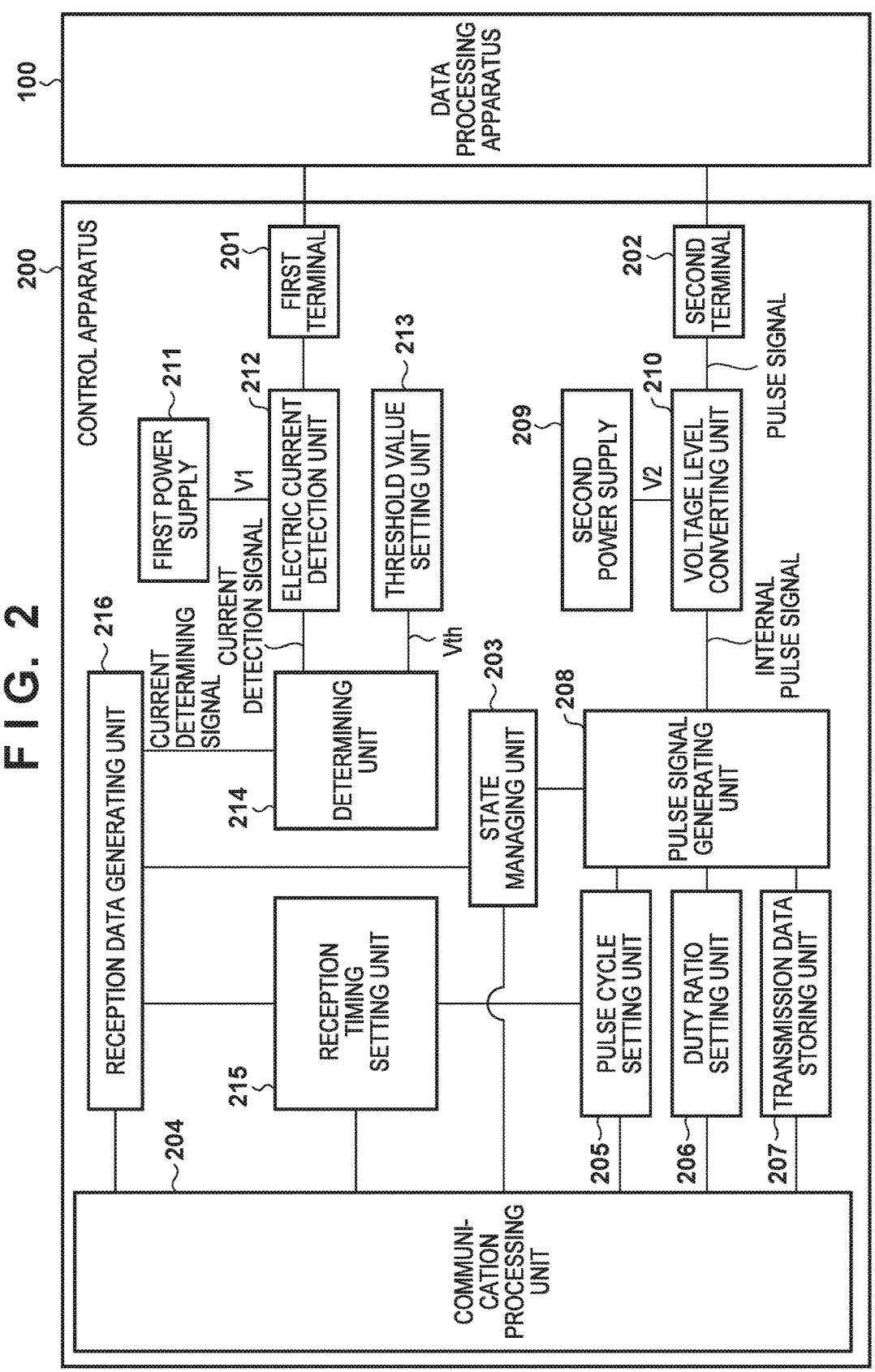
FIG. 2 is a configuration diagram of a control apparatus according to one embodiment.
Figure 4:
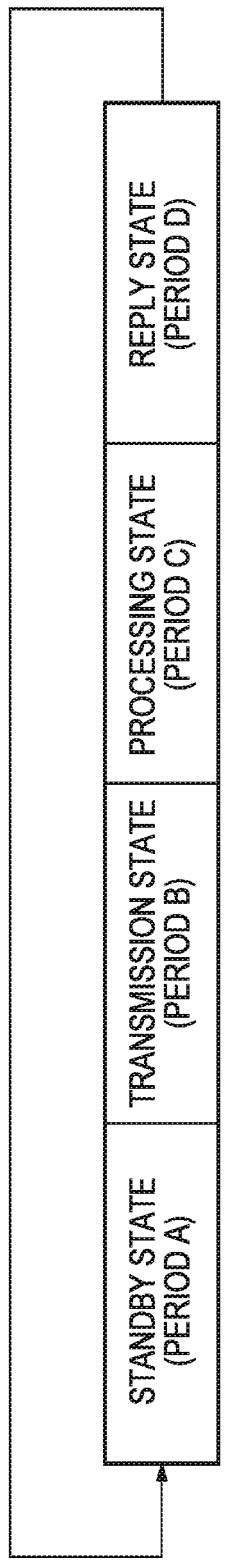
FIG. 4 is an illustrative diagram illustrating a state transition according to one embodiment.

FIGS. 1 and 2 are configuration diagrams of a data communication system according to the present embodiment. FIG. 1 shows the details of a data processing apparatus 100 that is a communication apparatus, and FIG. 2 shows the details of a control apparatus 200 that is a communication apparatus. The control apparatus 200 is an external apparatus of the data processing apparatus 100, and the data processing apparatus 100 is an external apparatus of the control apparatus 200. A first terminal 101 of the data processing apparatus 100 is connected to a first terminal 201 of the control apparatus 200, and a second terminal 102 of the data processing apparatus 100 is connected to a second terminal 202 of the control apparatus 200. That is, the data processing apparatus 100 and the control apparatus 200 are connected to each other by using two lines. In the communication system according to the present embodiment, four states that transition as shown in FIG. 4 are defined. Standby state is a state in which communication is not performed between the data processing apparatus 100 and the control apparatus 200. Transmission state is a state in which the control apparatus 200 transmits data to the data processing apparatus 100. Processing state is a state in which the data processing apparatus 100 performs processing such as generating reply data to be transmitted to the control apparatus 200 after receiving data from the control apparatus 200. Reply state is a state in which the data processing apparatus 100 transmits the reply data to the control apparatus 200. Hereinafter, the standby state, the transmission state, the processing state, and the reply state will be referred to as period A, period B, period C, and period D, respectively.

Figure 3:
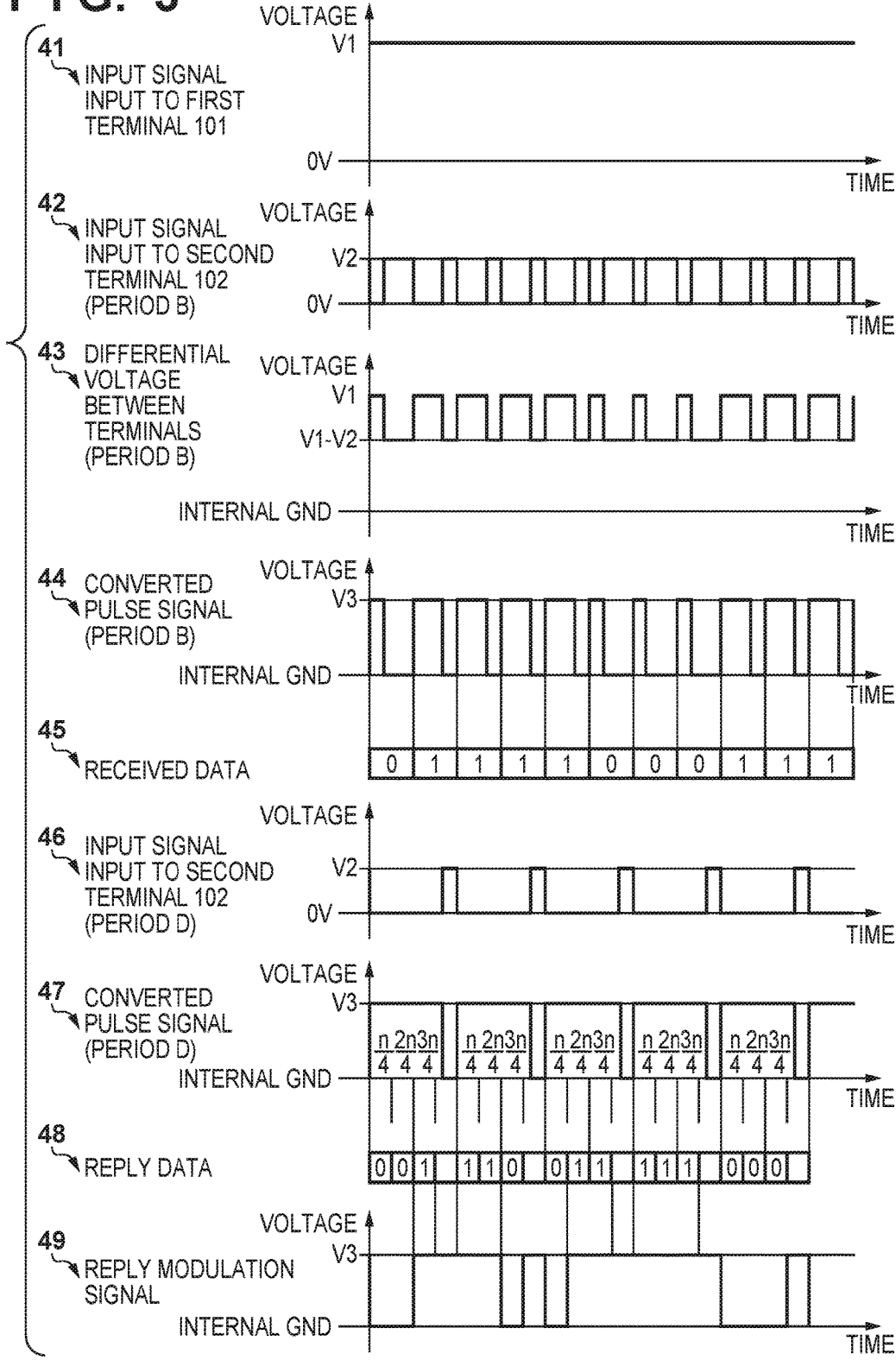
FIG. 3 is an illustrative diagram illustrating internal signals of the data processing apparatus according to one embodiment.

The first terminal 101 of the data processing apparatus 100 receives an input of a reference voltage V1 as indicated by reference numeral 41 shown in FIG. 3 via the first terminal 201 of the control apparatus 200. On the other hand, the second terminal 102 of the data processing apparatus 100 receives an input of a pulse signal that has an amplitude V2 as indicated by reference numeral 42 or reference numeral 46 shown in FIG. 3 via the second terminal 202 of the control apparatus 200. The amplitude V2 of the pulse signal is different from that of the reference voltage V1. In this example, V2 is set to be less than V1 (V2<V1). Reference numeral 42 indicates the pulse signal that is input during the period B. The cycle of the pulse signal is constant, and the duty ratio of the pulse signal varies according to the data value transmitted from the control apparatus 200. On the other hand, reference numeral 46 indicates the pulse signal that is input during the period D. The cycle of the pulse signal is an integer multiple of the cycle of the pulse signal input during the period B indicated by reference numeral 42, and the duty ratio of the pulse signal is constant. Although described later, during the period A and the period C, a pulse signal that has the same cycle as that of the pulse signal input during the period B is input. The ratio of the pulse signal cycle between the period D and the periods A to C has been shared in advance between the control apparatus 200 and the data processing apparatus 100. In the present embodiment, the cycle of the pulse signal input during the period D is set to be twice the cycle of the pulse signal input during the periods A to C.

Reference numeral 43 shown in FIG. 3 indicates a voltage waveform that is a difference between the reference voltage V1 input to the first terminal 101 and the pulse signal input to the second terminal 102. An internal power supply generating unit 103 of the data processing apparatus 100 smoothes the voltage indicated by reference numeral 43 shown in FIG. 3 so as to generate an operating voltage that is used by the constituent elements of the data processing apparatus 100, and supplies the generated operating voltage to the constituent elements. That is, the internal power supply generating unit 103 functions as an operating voltage generating unit. Hereinafter, the operating voltage generated by the internal power supply generating unit 103 will be represented by V3. A reception pulse converting unit 104 converts the level V1 of the voltage waveform indicated by reference numeral 43 shown in FIG. 3 to the level V3, and also converts the level (V1−V2) to the internal ground (GND) level, and then outputs a converted pulse signal that has a voltage waveform as indicated by reference numeral 44 or reference numeral 47 shown in FIG. 3. An internal clock generating unit 105 generates a clock signal (hereinafter, referred to as "internal clock") that is shorter than the cycle of the pulse signal input to the second terminal 102, or in other words, that has a high frequency. For example, the frequency of the internal clock is about 100 times the frequency of the pulse signal input during the periods A to C. A reception signal decoding unit 106 decodes received data based on the converted pulse signal and the internal clock. To be specific, the reception signal decoding unit 106 counts the width of the high level of the converted pulse signal and the width of the low level of the same based on the internal clock. Then, the reception signal decoding unit 106 decodes the data to "1" if the width of the high level during one cycle of the pulse signal is wider than the width of the low level, and otherwise decodes the data to "0". For example, if it is assumed that the converted pulse signal has a voltage waveform as indicated by reference numeral 44 shown in FIG. 3, the data is decoded to data values as indicated by reference numeral 45 shown in FIG. 3. The reception signal decoding unit 106 outputs the decoded data (received data) to a data input/output processing unit 108.

A storage 107 stores internal data of the data processing apparatus 100. The data input/output processing unit 108 generates, based on the received data, reply data that is to be returned to the control apparatus 200. For example, if the received data is an instruction to read out internal data stored in the storage unit 107, the data input/output processing unit 108 generates reply data by reading out the designated internal data from the storage unit 107. The data input/output processing unit 108 also manages the states shown in FIG. 4. A pulse cycle sampling unit 109 obtains the number of internal clocks (hereinafter, referred to as "count value") during one cycle of the pulse signal input during the period D in each period. In this example, the cycle of the pulse signal input during the period D is twice the cycle of the pulse signal input during the periods A to C. Accordingly, during the periods A to C, the pulse cycle sampling unit 109 counts the number of internal clocks during a period of two cycles of the pulse signal, and uses the counted number of internal clocks as the count value. On the other hand, during the period D, the pulse cycle sampling unit 109 counts the number of internal clocks during a period of one cycle of the pulse signal. Hereinafter, it is assumed that the count value is n.

A reply signal generating unit 110 generates a reply modulation signal according to the reply data generated by the data input/output processing unit 108. In the present embodiment, a reply modulation signal as indicated by reference numeral 49 shown in FIG. 3 is generated according to the reply data indicated by reference numeral 48 shown in FIG. 3. It is assumed here that the timing of the start of transmission of the reply modulation signal is the initial rising edge of the converted pulse signal after transition to the period D. As indicated by reference numeral 48 and reference numeral 49 shown in FIG. 3, if the reply data is "1", the reply modulation signal is at a high level (V3). If the reply data is "0", the reply modulation signal is at a low level (internal GND). The transmission period of a single bit is determined by the count value counted by the pulse cycle sampling unit 109 and a predetermined division number. The division number has been shared in advance between the control apparatus 200 and the data processing apparatus 100. In the present embodiment, as indicated by reference numeral 47, the division number is set to 4, and in the period D, the data processing apparatus 100 transmits reply data to the control apparatus 200 while the converted pulse signal is at a high level. Accordingly, as indicated by reference numerals 47 to 49 shown in FIG. 3, the data processing apparatus 100 transmits 3 bits of reply data for every cycle of the converted pulse signal during the period D. In the period D, while the converted pulse signal is at a low level, the level of the reply modulation signal is set to high as indicated by reference numeral 49 shown in FIG. 3. An electric current switching unit 111 increases or decreases the load between the first terminal 101 and the second terminal 102 according to the reply modulation signal that is input thereto. In the present embodiment, the electric current switching unit 111 decreases the electric current when the reply modulation signal is at a high level, and increases the electric current when the reply modulation signal is at a low level.

Next, the control apparatus 200 will be described in detail with reference to FIG. 2. A state managing unit 203 manages the states shown in FIG. 4. A communication processing unit 204 manages communication between the control apparatus 200 and the data processing apparatus 100, and generates data that is to be transmitted to the data processing apparatus 100. Also, the communication processing unit 204 sets, in a pulse cycle setting unit 205, the cycle of the pulse signal output via the second terminal 202 during the periods A to C, and the cycle of the pulse signal output via the second terminal 202 during the period D. As described above, in this example, the cycle of the pulse signal during the period D is twice the cycle of the pulse signal during the periods A to C. Also, the communication processing unit 204 sets, in a duty ratio setting unit 206, the duty ratio when the transmission data is "1" and the duty ratio when the transmission data is "0" during the periods A to C. In this example, the width of the high level is set to be shorter than the width of the low level when the transmission data is "1", and the width of the high level is set to be longer than the width of the low level when the transmission data is "0". Furthermore, the communication processing unit 204 also sets, in the duty ratio setting unit 206, the duty ratio of the pulse signal output from the second terminal 202 during the period D. Furthermore, the communication processing unit 204 stores, in a transmission data storing unit 207, data that is to be transmitted to the data processing apparatus 100 during the period B.

Figure 5:
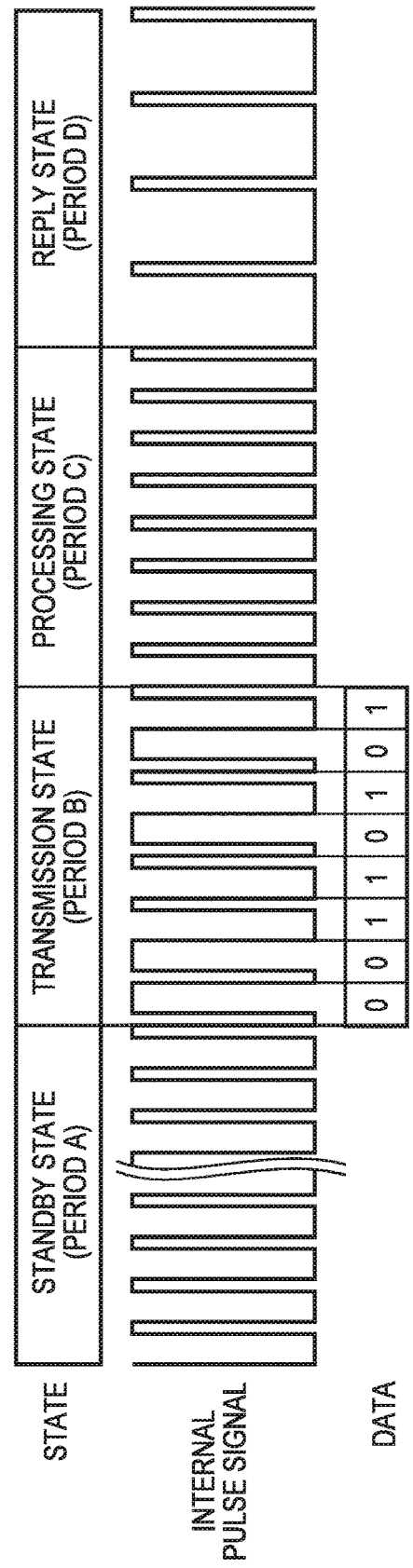
FIG. 5 is an illustrative diagram illustrating an internal pulse signal in each state.

A pulse signal generating unit 208 generates, based on the state informed from the state managing unit 203, an internal pulse signal that has a cycle set in the pulse cycle setting unit 205. To be specific, as shown in FIG. 5, in the transmission state (the period B), the pulse signal generating unit 208 generates an internal pulse signal that has a duty ratio that corresponds to the data value of the transmission data stored in the transmission data storing unit 207. The relationship between the data value and the duty ratio has been set in the duty ratio setting unit 206. As described above, in this example, the width of the high level is set to be shorter than the width of the low level when the transmission data is "1", and the width of the high level is set to be longer than the width of the low level when the transmission data is "0". On the other hand, in the standby state (the period A) and the processing state (the period C), the pulse signal generating unit 208 generates a pulse signal that has a duty ratio that corresponds to the data value "1". Furthermore, in the reply state (the period D), the pulse signal generating unit 208 generates a pulse signal that has a cycle and a duty ratio that correspond to the period D.

A second power supply 209 outputs a voltage V2. A voltage level converting unit 210 converts the levels of the internal pulse signal. To be specific, the voltage level converting unit 210 converts the high level of the internal pulse signal to the voltage V2, and converts the low level to the ground level. The pulse signal output from the voltage level converting unit 210 is transmitted to the data processing apparatus 100 via the second terminal 202. As indicated by reference numeral 44 shown in FIG. 3, the high level and the low level of the converted pulse signal generated by the data processing apparatus 100 are inverted to those of the internal pulse signal of the control apparatus 200 and the pulse signal that is transmitted from the control apparatus 200 to the data processing apparatus 100. Accordingly, as described above, the data processing apparatus 100 determines that the data value is "1" if the width of the high level is longer than the width of the low level, and determines that the data value is "0" if the width of the high level is shorter than the width of the low level.

Figure 6:
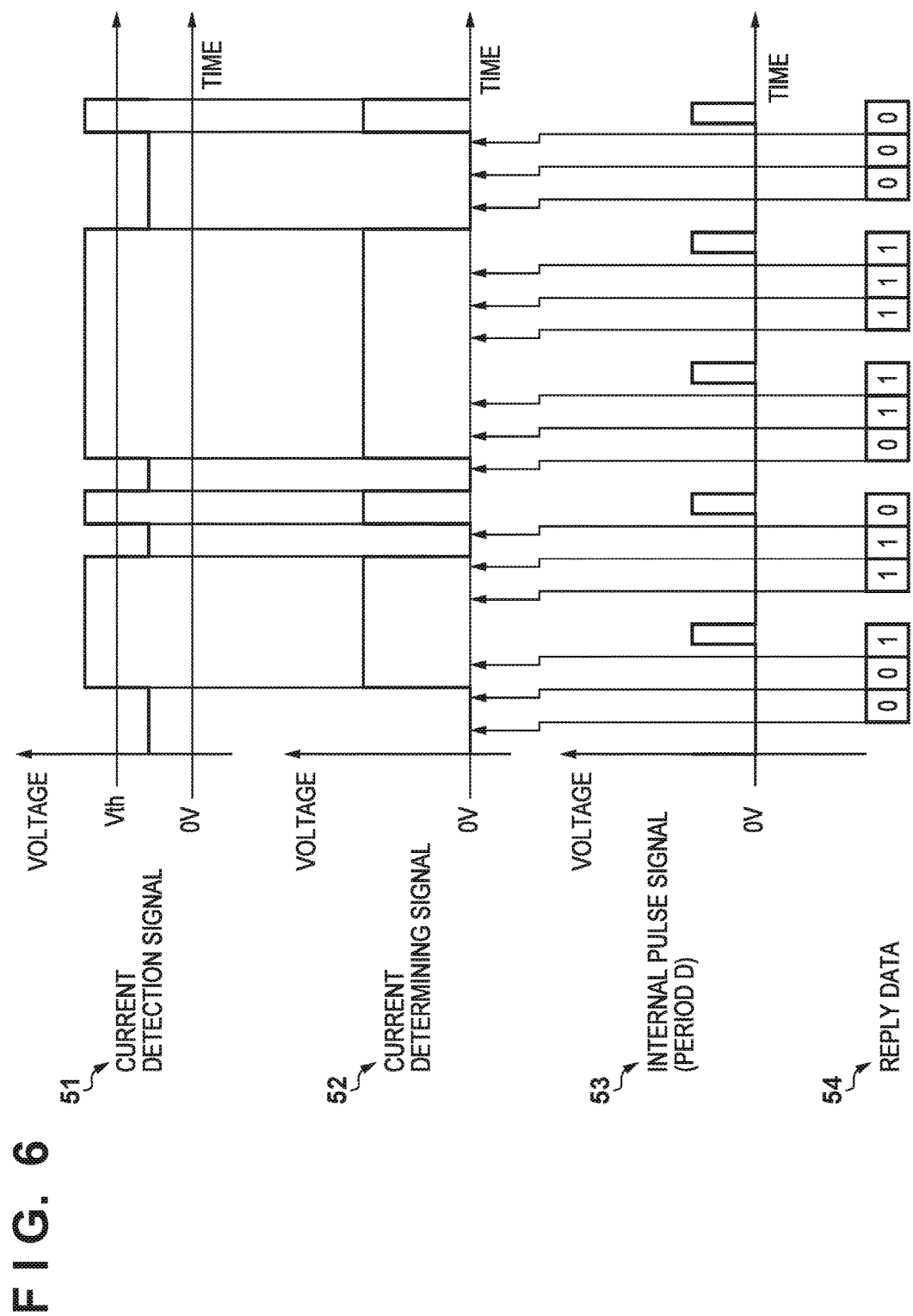
FIG. 6 is an illustrative diagram illustrating internal signals of the control apparatus according to one embodiment.

Reverting to FIG. 2, a first power supply 211 outputs a reference voltage V1. As described above, V1 is greater than V2 (V1>V2). An electric current detection unit 212 detects the electric current that flows from the first power supply 211 to the data processing apparatus 100, and outputs a current detection signal, as indicated by reference numeral 51 shown in FIG. 6, that is obtained by converting the detected current value to a voltage. In the present embodiment, a smaller current value is converted to a higher voltage. As described above, the electric current switching unit 111 of the data processing apparatus 100 decreases the electric current if the reply modulation signal is at a high level (the data value is "1"), and increases the electric current if the reply modulation signal is at a low level (the data value is "0"). Accordingly, when the electric current switching unit 111 increases or decreases the electric current based on the reply modulation signal indicated by reference numeral 49 shown in FIG. 3, the current detection signal has a waveform as indicated by reference numeral 51 shown in FIG. 6.

A threshold voltage Vth is set in a threshold value setting unit 213. The threshold voltage Vth is a value that is lower than the voltage output by the electric current detection unit 212 when the data processing apparatus 100 transmits the data value "1", and is higher than the voltage output by the electric current detection unit 212 when the data processing apparatus 100 transmits the data value "0". A determining unit 214 compares the current detection signal output by the electric current detection unit 212 with the threshold voltage Vth set in the threshold value setting unit 213, and outputs a current determining signal. As indicated by reference numeral 52 shown in FIG. 6, the current determining signal is at a high level when the current detection signal is higher than the threshold voltage Vth, and is at a low level when the current detection signal is lower than the threshold voltage Vth. A reception timing setting unit 215 determines and sets a data reception timing based on the cycle of the pulse signal during the period D set in the pulse cycle setting unit 205 and the division number (4 in this example) that has been shared in advance between the data processing apparatus 100 and the control apparatus 200.

A reception data generating unit 216 decodes the received data based on the current determining signal. The reception data generating unit 216 starts receiving data at a timing when the state managed by the state managing unit 203 is changed to the reply state. Likewise, the reception data generating unit 216 determines each bit value at a timing indicated by the reception timing setting unit 215, and in this example, at a timing that corresponds to one-quarter of the internal pulse signal during the period D as indicated by reference numeral 53 shown in FIG. 6. However, data is not received at the timing when the internal pulse signal is at a high level. Accordingly, the reception data generating unit 216 acquires reply data from the data processing apparatus 100 at a timing indicated by reference numeral 53 shown in FIG. 6. The data receiving timing can be corrected to be slightly earlier than the transition timing of the current determining signal, as indicated by the arrows in reference numeral 52 shown in FIG. 6.

The data processing apparatus 100 according to the present embodiment is configured to not transmit data while the converted pulse signal is at a low level as indicated by reference numeral 47 shown in FIG. 3 when transmitting reply data to the control apparatus 200 from the data processing apparatus 100. This is because the differential voltage between the first terminal 101 and the second terminal 102 is low while the converted pulse signal is at a low level. That is, as described above, in the present embodiment, the data processing apparatus 100 generates an internal operating power supply from the differential voltage between the first terminal 101 and the second terminal 102. Here, if the electric current switching unit 111 increases the electric current according to the value of reply data while the differential voltage between the first terminal 101 and the second terminal 102 is low, the differential voltage further decreases, which may affect the operating power supply of the data processing apparatus 100. Accordingly, in the present embodiment, the electric current switching unit 111 decreases the electric current (corresponding to the reply modulation signal being at a high level) while converted pulse signal is at a low level. However, if the operating power supply of the data processing apparatus 100 is not affected even when the electric current switching unit 111 increases the electric current while the differential voltage between the terminals is low, the data processing apparatus 100 may be configured to transmit reply data while the converted pulse signal is at a low level.

Next, a description will be given of a flow of processing of transmitting data from the control apparatus 200 to the data processing apparatus 100, and transmitting reply data from the data processing apparatus 100 to the control apparatus 200. At a start of operation, the communication processing unit 204 of the control apparatus 200 performs the initial setting of the cycle and duty ratio of the pulse signal described above in the pulse cycle setting unit 205 and the duty ratio setting unit 206, respectively. During a period after the start of operation and before data is transmitted to the data processing apparatus 100, the state managing unit 203 informs the other constituent elements that the state is the standby state. During the period A that is the standby state, the pulse signal generating unit 208 generates an internal pulse signal that corresponds to data value "1" as shown in FIG. 5. That is, the control apparatus 200 transmits data value "1" to the data processing apparatus 100 during the standby state. The communication processing unit 204, when transmitting data to the data processing apparatus 100, sets the data to be transmitted in the transmission data storing unit 207, and outputs a communication start instruction to the state managing unit 203. Upon receiving the communication start instruction, the state managing unit 203 causes its managing state to transition from the standby state to the transmission state. After transition to the transmission state, the pulse signal generating unit 208 generates an internal pulse signal according to the data stored in the transmission data storing unit 207, and the voltage level converting unit 210 converts the level of the internal pulse signal, and outputs a pulse signal to the data processing apparatus 100. For example, with respect to the data indicated by reference numeral 45 shown in FIG. 3, the voltage level converting unit 210 outputs a pulse signal as indicated by reference numeral 42 shown in FIG. 3.

As described above, the data processing apparatus 100 generates a converted pulse signal as indicated by reference numeral 44 shown in FIG. 3 by converting the level of difference between the reference voltage V1 and the voltage of the pulse signal from the control apparatus 200. The reception signal decoding unit 106 of the data processing apparatus 100 determines the data value based on the duty ratio of the converted pulse signal, and outputs reception data. To be specific, in this example, the reception signal decoding unit 106 determines that the data value is "1" if the width of the high level during one cycle of the converted pulse signal is longer than the width of the low level, and otherwise determines that the data value is "0". In the period A, data value "1" is successively received. The data input/output processing unit 108 monitors the received data even during the standby state. When the data value is changed from "1" to "0", the data input/output processing unit 108 determines that the state has transitioned from the standby state to the transmission state. Accordingly, for example, the value of data transmitted first by the control apparatus 200 after transition has made to the transmission state is "0". Then, after determination that transition has been made to the transmission state, the data input/output processing unit 108 receives data from the control apparatus 200.

Upon completion of data reception, the data input/output processing unit 108 causes its managing state to transition from the transmission state to the processing state. The data input/output processing unit 108 may determine, for example, that the data reception has finished if data that has a predetermined length is received. In this case, the length of data in a single instance of transmission and reception has been set in advance in the data processing apparatus 100 and the control apparatus 200. The data input/output processing unit 108 may also determine that the data reception has finished if a predetermined stop pattern is received. Furthermore, the data input/output processing unit 108 may determine that the data reception has finished if data that has a length indicated by the header of the data is received. During the processing state, the data input/output processing unit 108 generates reply data.

After transition to the processing state, the pulse signal generating unit 208 of the control apparatus 200 continues outputting data value "1". In the present embodiment, the length of the period C has been set in advance in the data processing apparatus 100 and the control apparatus 200. Accordingly, the state managing unit 203 of the control apparatus 200 causes the state to transition from the processing state to the reply state when the period C with a set length has passed. The same applies to the data input/output processing unit 108 of the data processing apparatus 100. After transition to the reply state, the pulse signal generating unit 208 of the control apparatus 200 outputs an internal pulse signal that has a cycle and a duty ratio that correspond to the period D as indicated by reference numeral 53 shown in FIG. 6. Accordingly, the data processing apparatus 100 receives the pulse signal indicated by reference numeral 46 shown in FIG. 3.

The reply signal generating unit 110 of the data processing apparatus 100 generates, based on the reply data input from the data input/output processing unit 108, a reply modulation signal as indicated by reference numeral 49 shown in FIG. 3. The electric current switching unit 111 switches the magnitude of the electric current consumed by the data processing apparatus 100 by switching the load between the first terminal 101 and the second terminal 102 based on the received reply modulation signal. In the present embodiment, the electric current is decreased when the reply modulation signal is at a high level, and the electric current is increased when the reply modulation signal is at a low level. That is, the electric current when the reply data is "1" is set to be smaller than the electric current when the reply data is "0". The electric current detection unit 212 of the control apparatus 200 outputs a current detection signal that has a higher voltage as the electric current that flows through the data processing apparatus 100 is smaller. Accordingly, based on the reply modulation signal indicated by reference numeral 49 shown in FIG. 3, the electric current detection unit 212 of the control apparatus 200 outputs a current detection signal as indicated by reference numeral 51 shown in FIG. 6. The determining unit 214 outputs a current determining signal as indicated by reference numeral 52 shown in FIG. 6 based on the threshold value set in the threshold value setting unit 213.

The reception data generating unit 216 determines the data value of the reception data based on the current determining signal. The determination timing of each bit data value is shown by the reception timing setting unit 215. In the present embodiment, the cycle of the pulse signal during the period D is set to be twice that of the periods other than the period D. However, the control apparatus 200 can receive three bits of data in one cycle of the pulse signal during the period D. In a conventional configuration, the cycle of the pulse signal during the period D is the same as that of the periods A to C, but only one bit of data can be transmitted in one cycle. Accordingly, in the present embodiment, the data processing apparatus 100 can transmit, to the control apparatus 200, an amount of data corresponding to 1.5 times that of the conventional configuration.

Also, in the present embodiment, the data processing apparatus 100 counts the cycle of the pulse signal from the control apparatus 200 based on the internal clock generated by the data processing apparatus 100, and determines the data (bit) switch timing of the reply data based on the count value. To be specific, during the period D, one bit of reply data is transmitted at a rising edge of the converted pulse signal. In the present embodiment, at least two bits of data is transmitted in one cycle of the converted pulse signal during the period D, and thus at least one data switch timing occurs during the one cycle. The data processing apparatus 100 determines the switch timing during the period of the one cycle based on, for example, the count value of the internal clock during the previous cycle. The bit switch timing of the reply data transmitted during the initial one cycle of the converted pulse signal after transition has made been to the period D is determined based on, for example, the count of the internal clock during a period of the last two cycles of the pulse signal during the period C. In doing so, even if the internal clock output by the internal clock generating unit 105 of the data processing apparatus 100 varies, the switch timing of the reply data is corrected by using the cycle of the pulse signal output from the control apparatus 200. As a result, the control apparatus 200 can read the reply data at a stable timing. A configuration is also possible in which the bit switch timing in each cycle of the pulse signal during the period D is determined based on the count value of the internal clock during a period of two cycles of the pulse signal during the periods A to C. In this case, even if the internal clock varies during the reply state, the subsequent reply state is not affected by the variation of the internal clock. It is also possible to determine the bit switch timing in each cycle of the pulse signal during the period D based on, for example, an average value of the count values obtained every two cycles of the pulse signal during the periods A to C.

As in the present embodiment, in the data processing apparatus 100 that performs reception of operating power from the control apparatus 200, and signal transmission and reception by using two lines, normally, it is often the case that a highly accurate and stable oscillator such as a crystal oscillator is not used as the internal clock generating unit 105. Accordingly, the correction effect of the oscillation frequency is advantageous. With the configuration described above, the transmission rate between the control apparatus 200 and the data processing apparatus 100 can be increased.

Second Embodiment

Figure 7:
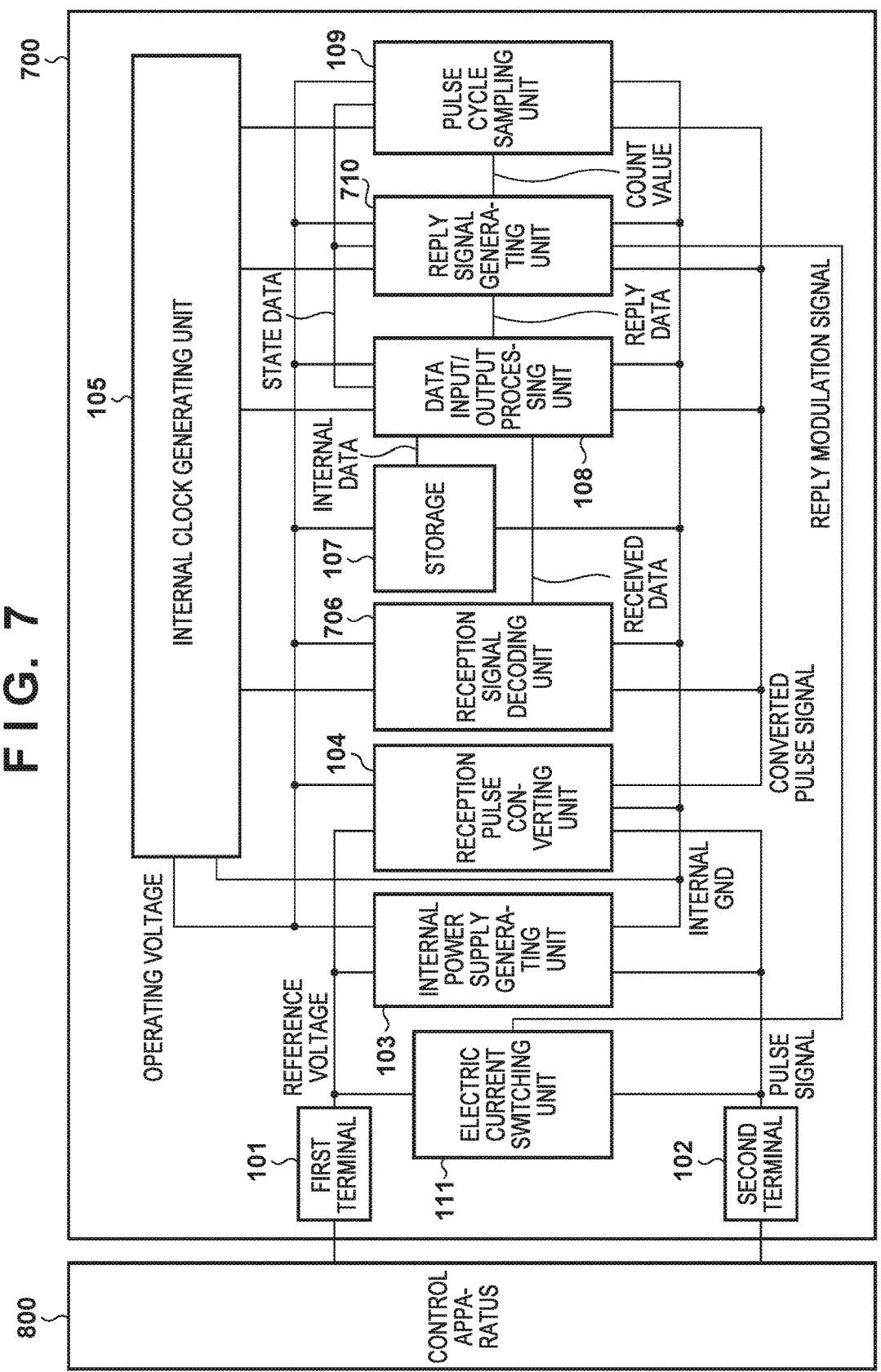
FIG. 7 is a configuration diagram of a data processing apparatus according to one embodiment.
Figure 9:
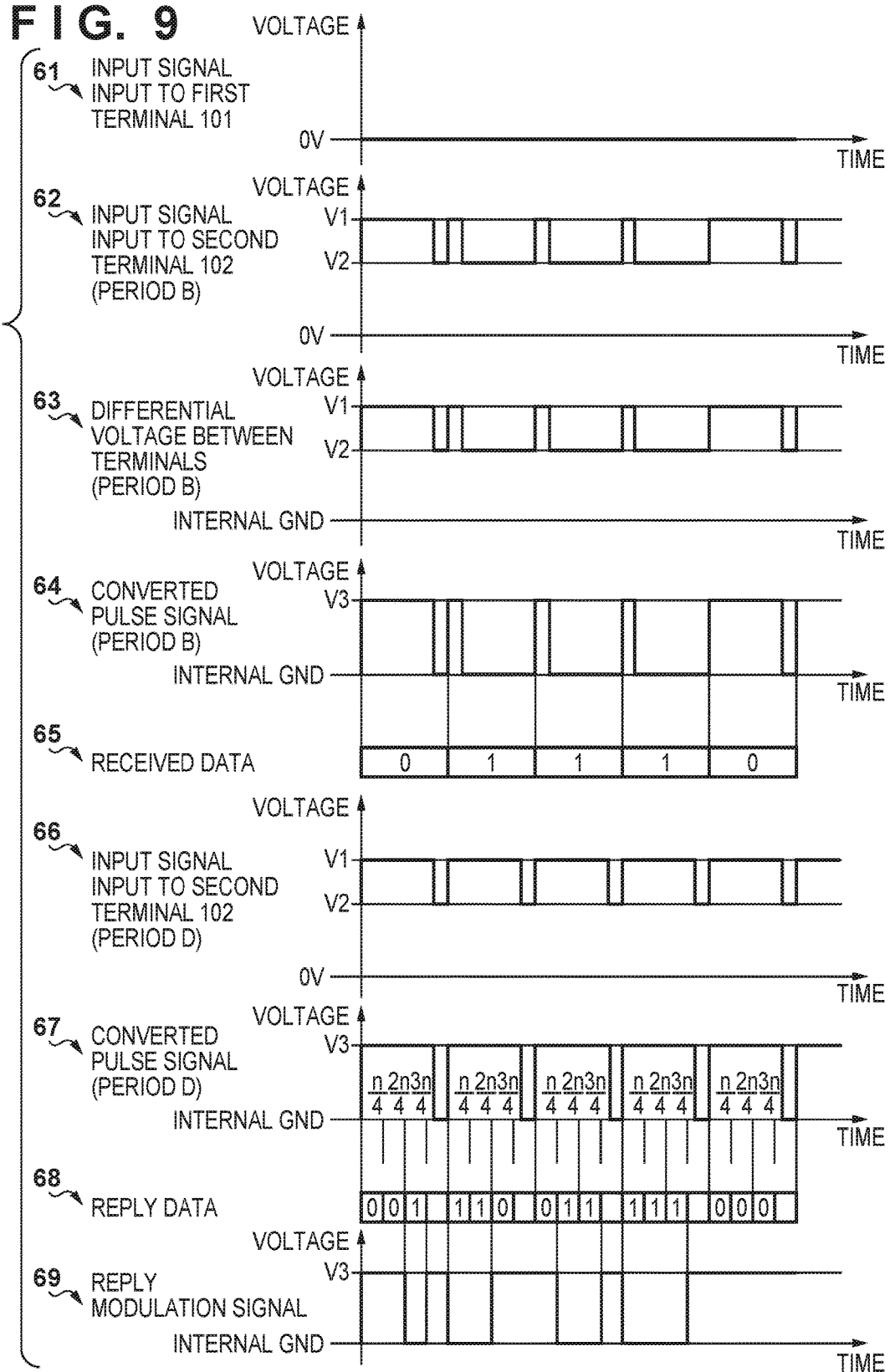
FIG. 9 is an illustrative diagram illustrating internal signals of the data processing apparatus according to one embodiment.

Next, a second embodiment will be described focusing on differences from the first embodiment. In the diagrams mentioned below, the constituent elements that are the same as those already described in the first embodiment are given the same reference numerals, and a description thereof will be omitted. FIG. 7 is a configuration diagram of a data processing apparatus 700 according to the present embodiment. In the present embodiment, as a reference voltage, 0 V is input to the first terminal 101 from a control apparatus 800 as indicated by reference numeral 61 shown in FIG. 9. On the other hand, a pulse signal whose high level has an amplitude V1 and whose low level has an amplitude V2 as indicated by reference numeral 62 or 66 shown in FIG. 9 is input to the second terminal 102. Reference numeral 62 shown in FIG. 9 indicates the pulse signal that is input during the period B, and as in the first embodiment, the pulse signal has a constant cycle and a duty ratio that varies according to the data value. Also, reference numeral 66 shown in FIG. 9 indicates the pulse signal that is input during the period D, and as in the first embodiment, the pulse signal has a predetermined duty ratio. In the present embodiment as well, the cycle of the pulse signal input during the period D indicated by reference numeral 66 shown in FIG. 9 is set to an integer multiple of the cycle of the pulse signal input during the periods A to C. In this example, unlike the first embodiment, the cycle of the pulse signal input during the period D is set to one time the cycle of the pulse signal input during the periods A to C. In the present embodiment, the differential voltage between the first terminal 101 and the second terminal 102 during the period B has a waveform as indicated by reference numeral 63 shown in FIG. 9, and the converted pulse signal output from the reception pulse converting unit 104 is as indicated by reference numerals 64 and 67 shown in FIG. 9.

A reception signal decoding unit 706 determines the duty ratio of the converted pulse signal based on the internal clock, and determines whether the data value is "0" or "1" according to the determined duty ratio. In the present embodiment, unlike the first embodiment, the reception signal decoding unit 706 determines that the data value is "1" if the width of the low level of the converted pulse signal is larger than the width of the high level, and otherwise determines that the data value is "0". Accordingly, the converted pulse signal indicated by reference numeral 64 shown in FIG. 9 is decoded to a data value as indicated by reference numeral 65 shown in FIG. 9.

A reply signal generating unit 710 generates a reply modulation signal that is to be transmitted to the control apparatus 800. In the present embodiment, unlike the first embodiment, the reply modulation signal is set to a low level (internal GND) when the data value is "1", and set to a high level (V3) when the data value is "1". As in the first embodiment, bit switching is performed at a timing obtained by dividing one cycle of the converted pulse signal by a preset division number. As in the first embodiment, the pulse cycle sampling unit 109 determines the bit switch timing based on the count value of the internal clock. In this example as well, the division number is set to 4. Accordingly, with respect to the reply data indicated by reference numeral 68 shown in FIG. 9, a reply modulation signal as indicated by reference numeral 69 shown in FIG. 9 is generated.

Figure 8:
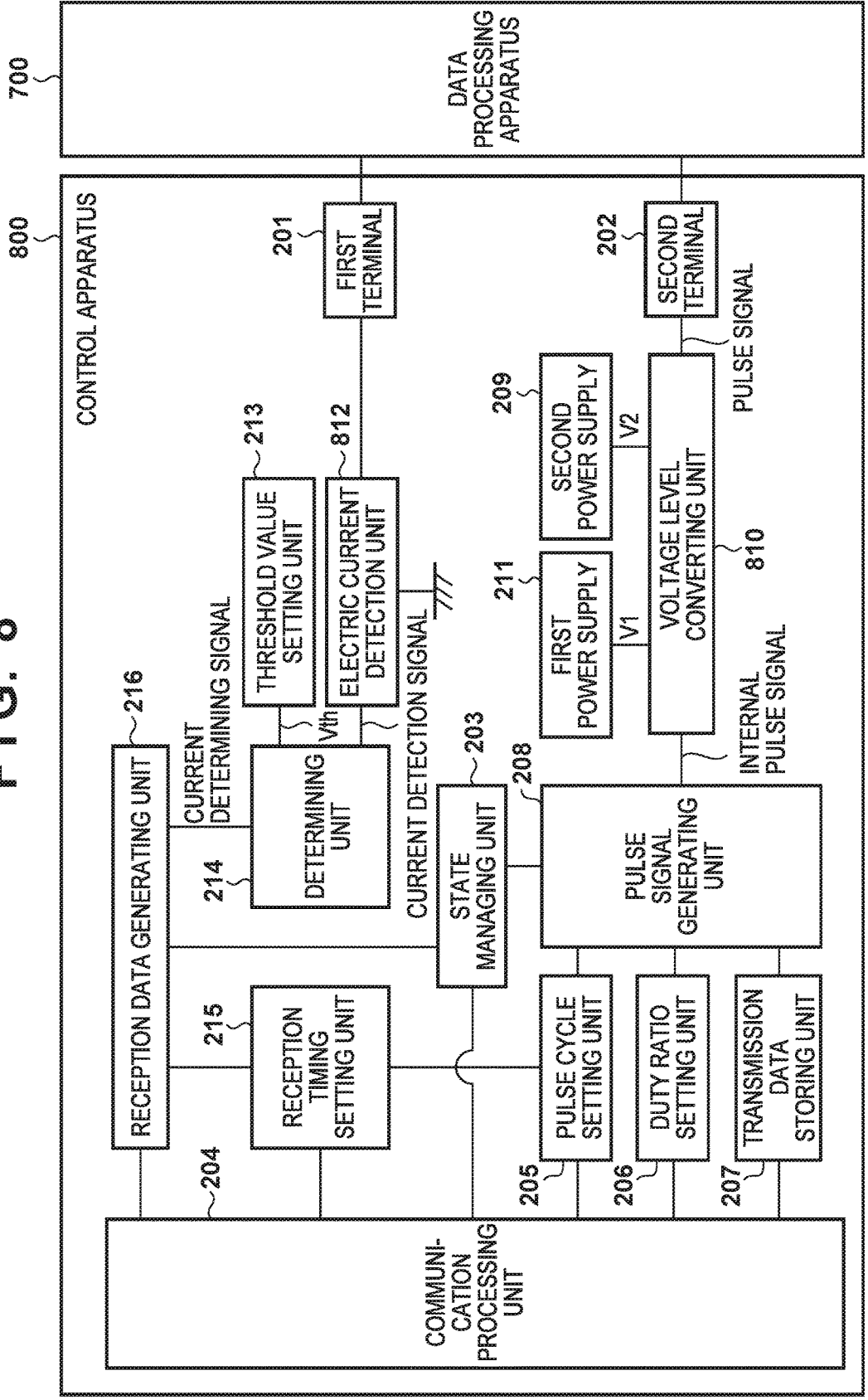
FIG. 8 is a configuration diagram of a control apparatus according to one embodiment.

FIG. 8 is a configuration diagram of the control apparatus 800 according to the present embodiment. In the first embodiment, the first power supply 211 is connected to the electric current detection unit 212 because the first terminal 201 is configured to output V1 as a reference voltage. In the present embodiment, because the first terminal 201 is configured to output 0 V as a reference voltage, the first power supply 211 is not connected to an electric current detection unit 812, and instead, the electric current detection unit 812 is grounded. On the other hand, in the first embodiment, the second terminal 202 is configured to output a pulse signal whose high level is set to V2 and whose low level is set to 0 V. However, in the present embodiment, as already described, a pulse signal whose high level is set to V1 and whose low level is set to V2 is output. Accordingly, in addition to the second power supply 209, the first power supply 211 is connected to a voltage level converting unit 810.

Figure 10:
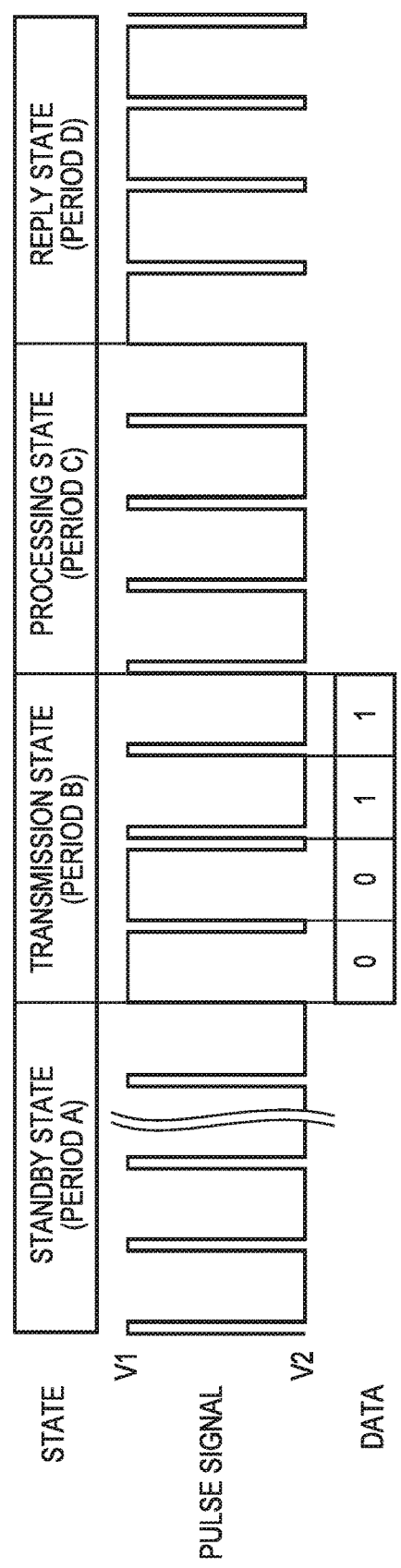
FIG. 10 is an illustrative diagram illustrating an internal pulse signal in each state.

FIG. 10 shows an internal pulse signal output from the pulse signal generating unit 208 of the control apparatus 800 in each state. As in the first embodiment, the internal pulse signal output during the periods A to C is configured such that the width of the high level is set to be shorter than the width of the low level when the transmission data is "1", and the width of the high level is set to be longer than the width of the low level when the transmission data is "0". Also, as in the first embodiment, in the periods A and C, data value "1" is output.

Figure 11:
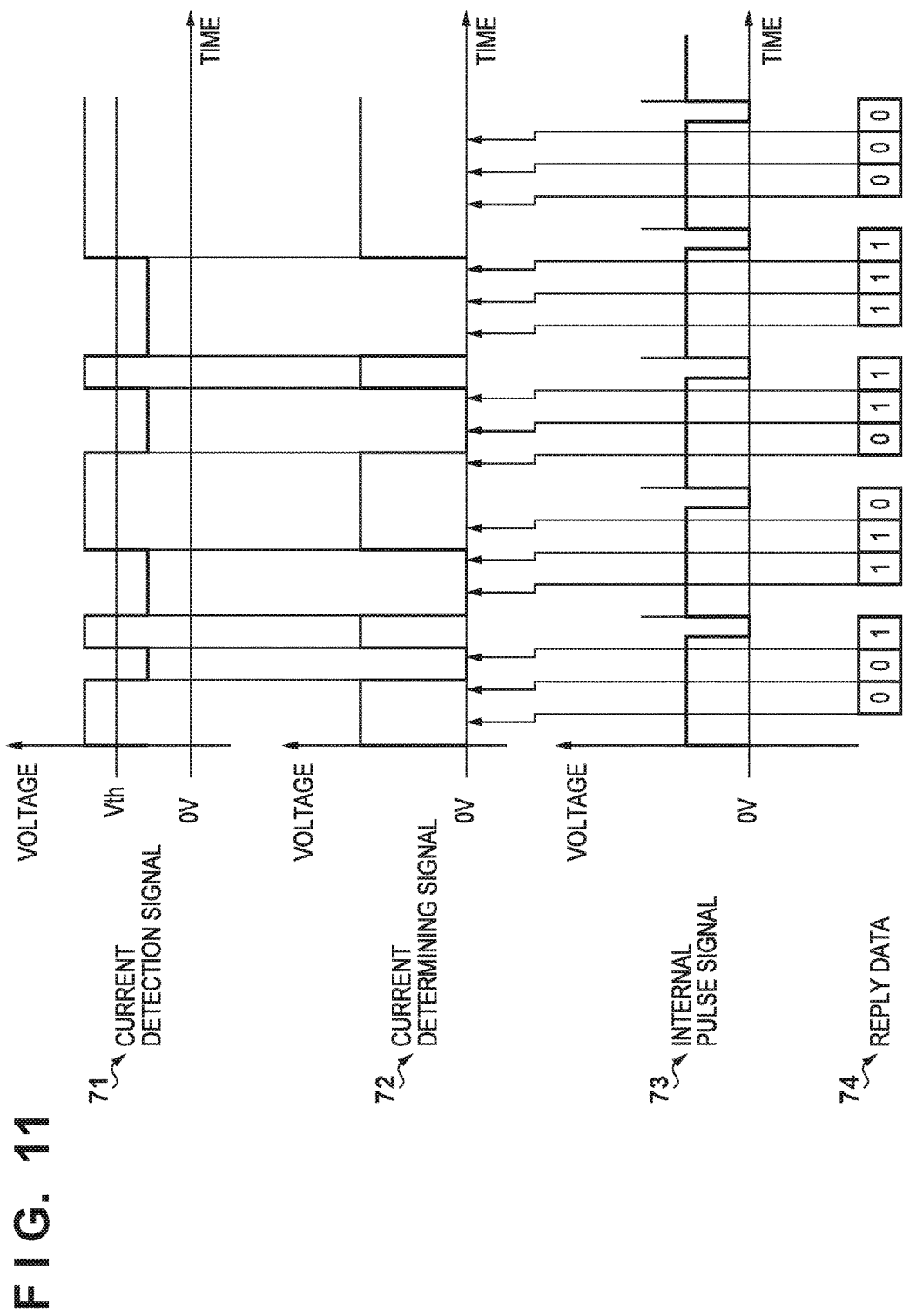
FIG. 11 is an illustrative diagram illustrating internal signals of the control apparatus according to one embodiment.

As in the first embodiment, the electric current switching unit 111 of the data processing apparatus 700 increases or decreases the electric current based on the reply modulation signal. Accordingly, with respect to the reply modulation signal indicated by reference numeral 69 shown in FIG. 9, the electric current detection unit 812 of the control apparatus 800 outputs a current detection signal as indicated by reference numeral 71 shown in FIG. 11. Accordingly, the determining unit 214 outputs a current determining signal as indicated by reference numeral 72 shown in FIG. 11. However, as can be seen from reference numerals 48 and 49 shown in FIG. 3 and reference numerals 68 and 69 shown in FIG. 9, the high level/low level relationship between the data value and the reply modulation signal is inverted from that of the first embodiment. Accordingly, as indicated by reference numeral 74 shown in FIG. 11, the reception data generating unit 216 determines that the data value is "0" when the current determining signal is at a high level, and determines that the data value is "1" when the current determining signal is at a low level. The timing at which the data value is determined is based on the timing obtained by dividing the internal pulse signal indicated by reference numeral 73 shown in FIG. 11 by a division number, as in the first embodiment.

Third Embodiment

Figure 12:
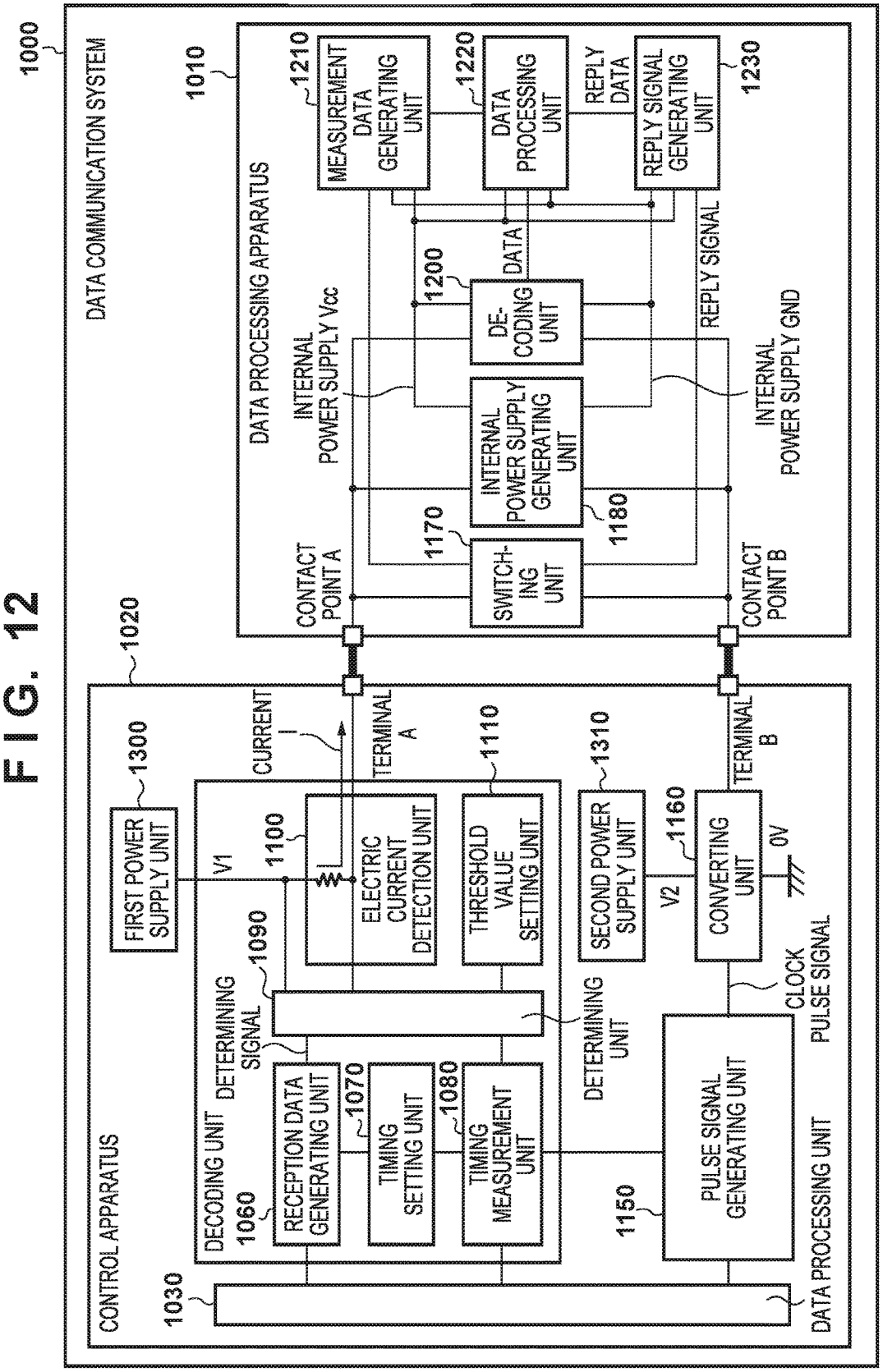
FIG. 12 is a configuration diagram of a data communication system according to one embodiment.

Next, a third embodiment will be described. FIG. 12 is a configuration diagram of a data communication system 1000 according to the present embodiment. The data communication system 1000 includes a control apparatus 1020 and a data processing apparatus 1010. The control apparatus 1020 includes terminals A and B, and the terminals A and B are respectively connected to (terminals) contact points A and B of the data processing apparatus 1010 by using lines. A first power supply unit 1300 included in the control apparatus 1020 outputs a voltage V1, and the voltage V1 is applied, as a reference voltage, to the contact point A of the data processing apparatus 1010 via an electric current detection unit 1100 and the terminal A. A second power supply unit 1310 outputs a voltage V2 (V1>V2) to a converting unit 1160. The converting unit 1106 is also connected to the ground potential (0 V). A pulse signal generating unit 1150 outputs a clock pulse signal that is the internal pulse signal of the control apparatus 1020 to the converting unit 1160. The converting unit 1160 outputs the voltage V2 while the input clock pulse signal is at a low level, and outputs 0 V while the clock pulse signal is at a high level. Accordingly, a pulse signal is obtained whose potential difference Vab between the terminal A and the terminal B has a maximum value of generally V1 and a minimum value of generally (V1−V2). Hereinafter, the pulse signal will be referred to as "pulse signal Vab", and the voltage of the pulse signal Vab will be referred to as "pulse voltage Vab". The control apparatus 1020 transmits data to the data processing apparatus 1010 through pulse width modulation of the pulse signal Vab. On the other hand, the data processing apparatus 1010 transmits data to the control apparatus 1020 by increasing or decreasing the electric current that flows from the terminal A to the contact point A. An internal power supply generating unit 1180 included in the data processing apparatus 1010 generates, from the pulse voltage Vab, an internal power supply Vcc that is to be used by the constituent elements of the data processing apparatus 1010.

Figure 13:
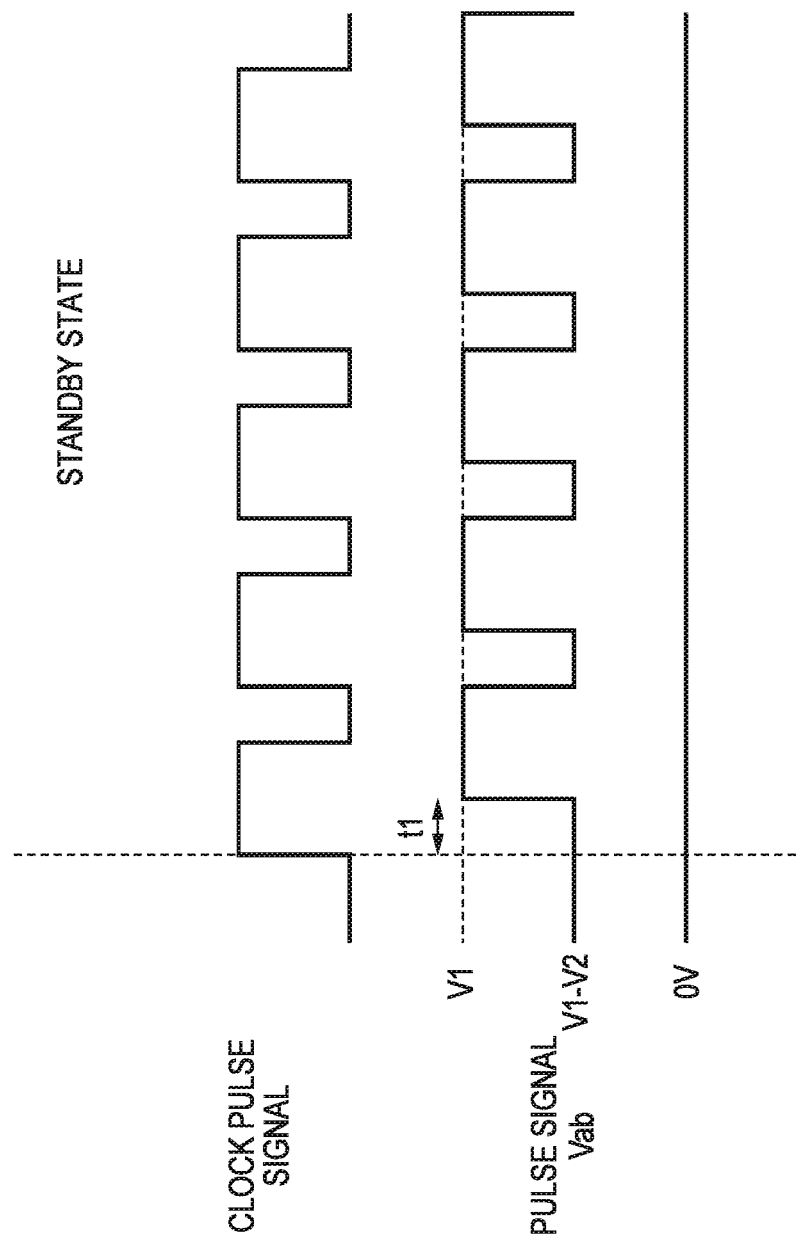
FIG. 13 is a diagram showing signal waveforms in a standby state according to one embodiment.

FIG. 13 shows signal waveforms in the standby state. As shown in FIG. 13, in the standby state, the pulse signal generating unit 1150 generates a clock pulse signal that has a constant duty ratio. The converting unit 1160 converts the high level of the clock pulse signal to 0 V and the low level voltage to V2, and then outputs the signal. Accordingly, as shown in FIG. 13, the pulse signal Vab has a waveform obtained by replacing the high level and the low level of the clock pulse signal with the voltage V1 and the voltage (V1−V2), respectively. In the pulse signal Vab, a delay occurs relative to the clock pulse signal by a processing delay time t1 in the converting unit 1160. The processing delay time t1 occurs equally in all states.

Figure 14:
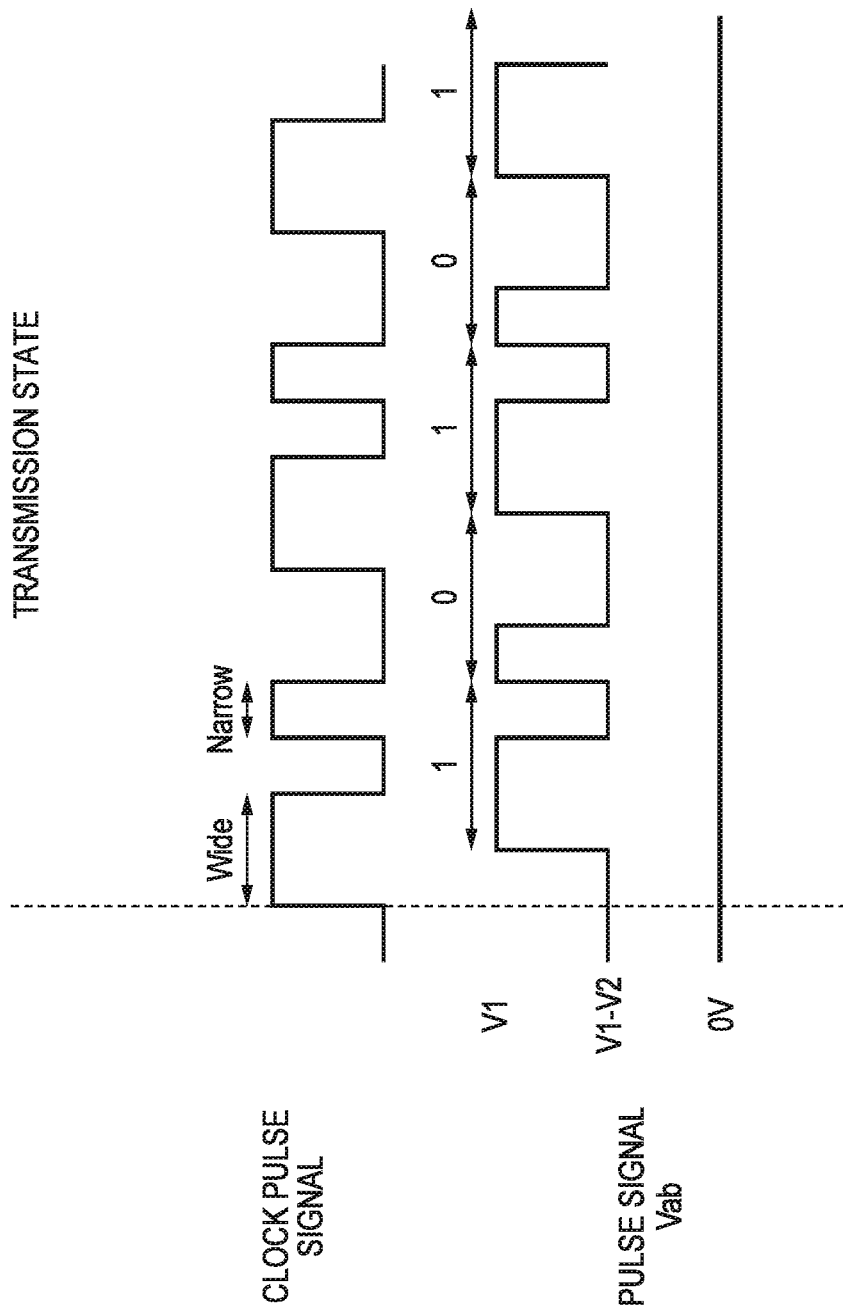
FIG. 14 is a diagram showing signal waveforms in a transmission state according to one embodiment.

FIG. 14 shows signal waveforms in the transmission state. In the transmission state, the control apparatus 1020 transmits data to the data processing apparatus 1010. In FIG. 14, the data is represented by "10101". A data processing unit 1030 included in the control apparatus 1020 generates a transmission data string, and outputs the transmission data string to the pulse signal generating unit 1150. The pulse signal generating unit 1150 is configured to be capable of generating pulses of two duty ratios: "Wide" and "Narrow". As used herein, "Wide" refers to a pulse in which the length of time of the high level is longer than the length of time of the low level during one cycle, and "Narrow" refers to a pulse in which the length of time of the low level is longer than the length of time of the high level during one cycle. In the present embodiment, the data value "1" is associated with a wide pulse, and the data value "0" is associated with a narrow pulse. Then, in the transmission state, the pulse signal generating unit 1150 outputs a clock pulse signal that has a pulse according to the data value as shown in FIG. 14. Accordingly, the pulse signal Vab has a signal waveform as shown in FIG. 14.

The pulse signal Vab is input to a decoding unit 1200 included in the data processing apparatus 1010. The decoding unit 1200 decodes data by specifying the data value from the duty ratio of each pulse of the pulse signal Vab. The decoded data is input to a data processing unit 1220.

Upon completion of the transmission state, or in other words, upon completion of transmission of data from the control apparatus 1020 to the data processing apparatus 1010 during one cycle, the state transitions to the processing state. In the processing state, the data processing unit 1220 of the data processing apparatus 1010 performs processing according to the content of the data received during the transmission state, and generates reply data. The period of the processing state is constant, and the waveforms of the clock pulse signal and the pulse signal Vab are the same as those in the standby state shown in FIG. 13.

Figure 15:
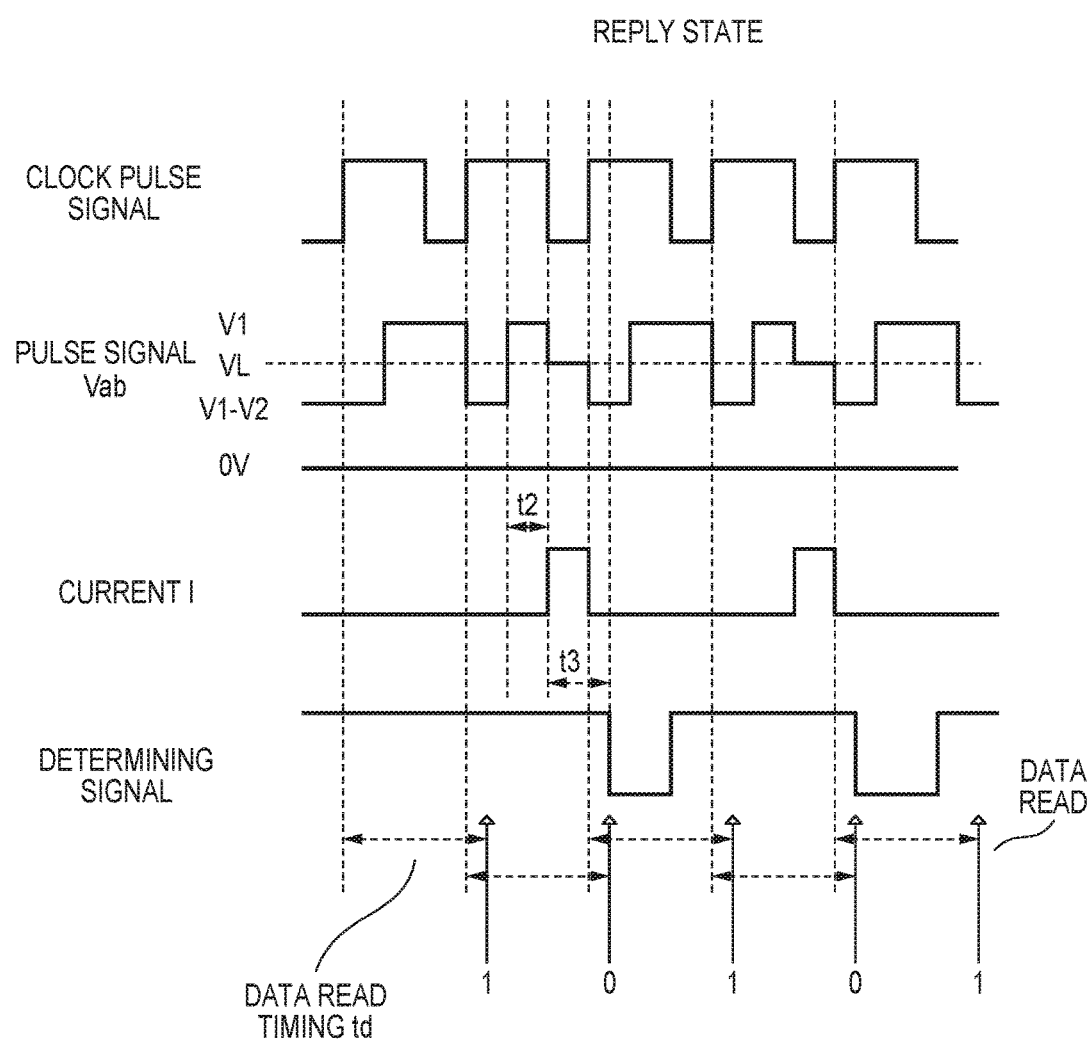
FIG. 15 is a diagram showing signal waveforms in a reply state according to one embodiment.

Upon completion of the processing state, the state transitions to the reply state. The signal waveforms shown in FIG. 15 are signal waveforms in the reply state. In the reply state, the data processing apparatus 1010 transmits reply data to the control apparatus 1020. In FIG. 15, the data is represented by "10101". Also, the pulse signal generating unit 1150 of the control apparatus 1020 outputs wide pulses during the reply state. Also, the data processing unit 1220 of the data processing apparatus 1010 outputs a reply data string to a reply signal generating unit 1230. The reply signal generating unit 1230 generates a reply signal that indicates the data value of the reply data, and outputs the reply signal to a switching unit 1170. When the pulse signal Vab is set to a high level, the switching unit 1170 performs control such that an electric current I that corresponds to the data value of the reply data flows. In the present embodiment, the current value when the data value is "0" is set to be greater than the current value when the data value is "1" by an amount corresponding to a threshold value or more. As shown in FIG. 15, a delay time t2 occurs between when the pulse signal Vab is changed from the low level to the high level and when the switching unit 1170 changes the electric current. When the electric current I increases, the amount of voltage drop due to resistance in the electric current detection unit 1100 of the control apparatus 1020 increases, and the voltage applied to the contact point A decreases. Accordingly, the voltage of the high level of the pulse signal Vab decreases from V1 to VL as shown in FIG. 15 if the data value of the reply data is "0".

A determining unit 1090 included in the control apparatus 1020 compares the difference between the voltage V1 output from the first power supply unit 1300 and the voltage of the terminal A with a threshold value set in a threshold value setting unit 1110. Then, the determining unit 1090 outputs, to a reception data generating unit 1060, a determining signal in which the period during which the difference is greater than the threshold value is indicated by a low level as shown in FIG. 15. Here, a delay time t3 occurs between when there is a change in the electric current I and when the determining unit 1090 determines whether to increase or decrease the electric current.

As will be described later, a timing setting unit 1070 stores determination timing information that indicates a determination timing measured by a timing measurement unit 1080. Then, the reception data generating unit 1060 determines whether the data value of the reply data is "1" or "0" by determining the level of the determining signal during the determination timing, and outputs the determined reply data to the data processing unit 1030. As shown in FIG. 15, in this example, the determination timing information is the time from the rising edge of the clock pulse signal: td=t1+t2+t3. However, the determination timing information can be information that indicates a relative temporal position with respect to a predetermined position of a pulse of the clock pulse signal such as the time from a falling edge of the clock pulse signal, or the time from the center position between edges.

Figure 16:
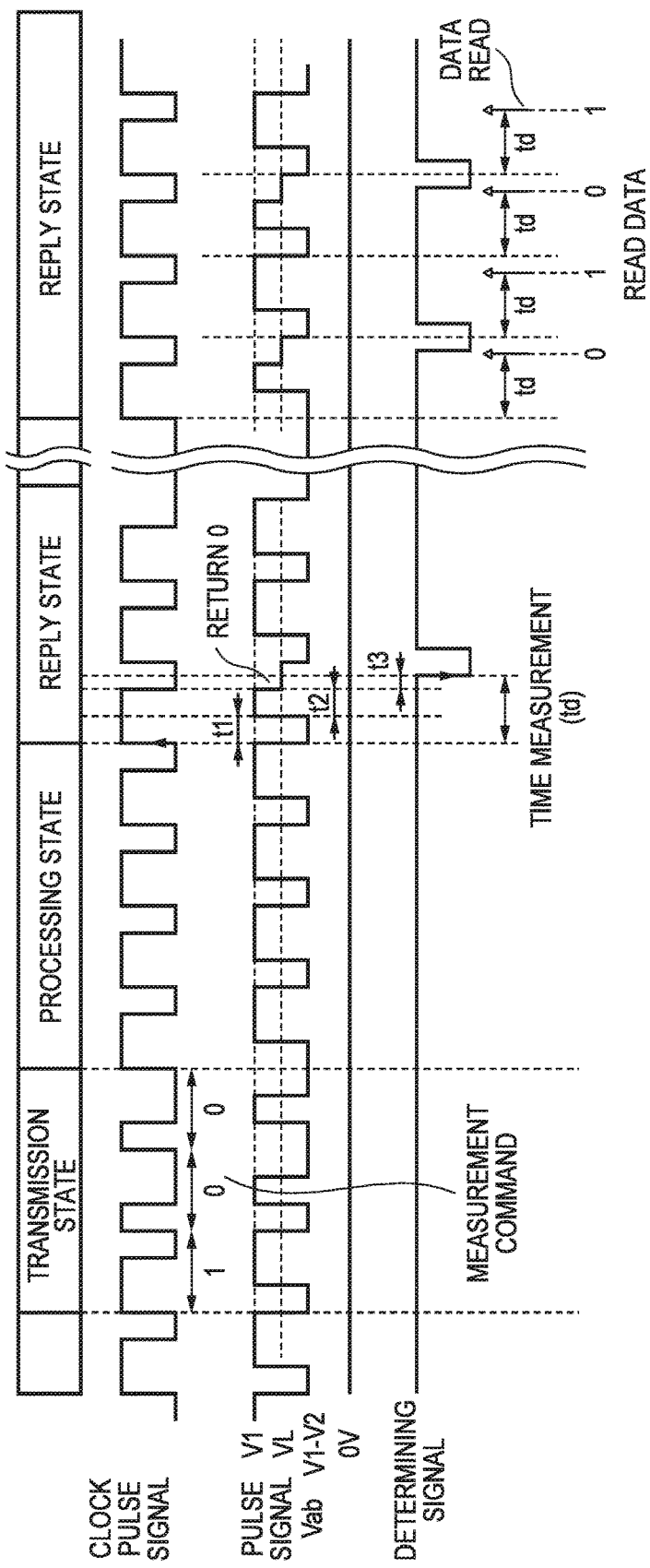
FIG. 16 is an illustrative diagram illustrating determination timing measurement according to one embodiment.

Next, a method for determining the determination timing set in the timing setting unit 1070 will be described with reference to FIG. 16. In the present embodiment, in a transmission state, for example, in the initial transmission state, a measurement command that is an instruction to measure the determination timing is transmitted from the control apparatus 1020 to the data processing apparatus 1010. A data string that corresponds to the measurement command has been shared in advance between the control apparatus 1020 and the data processing apparatus 1010. In this example, as shown in FIG. 16, a data string "100" is set as the measurement command.

Upon receiving the measurement command, in a processing state, the data processing unit 1220 of the data processing apparatus 1010 causes a measurement data generating unit 1210 to generate measurement data for measuring a read timing. The measurement data is a data string whose value of the first data is "0" and that has an arbitrary length.

After transition to the reply state, the timing measurement unit 1080 of the control apparatus 1020 measures a length of time from the first rising edge of the clock pulse signal generated by the pulse signal generating unit 1150 to a falling edge of the current determining signal. The timing measurement unit 1080 sets the measured length of time td in the timing setting unit 1070 as determination timing information. In the subsequent reply state, the reception data generating unit 1060 determines the level of the determining signal at a timing after the length of time td has passed from a rising edge of the clock pulse signal, and specifies the data value. In this example, the length of time td is measured based only on the first pulse of the clock pulse signal after transition has been made to the reply state, but it is also possible to measure a length of time from each of one or more predetermined pulses during the reply state to a falling edge of the current determining signal. In this case, the average value of the lengths of time measured in the pulses is set as the length of time td.

Figure 18:
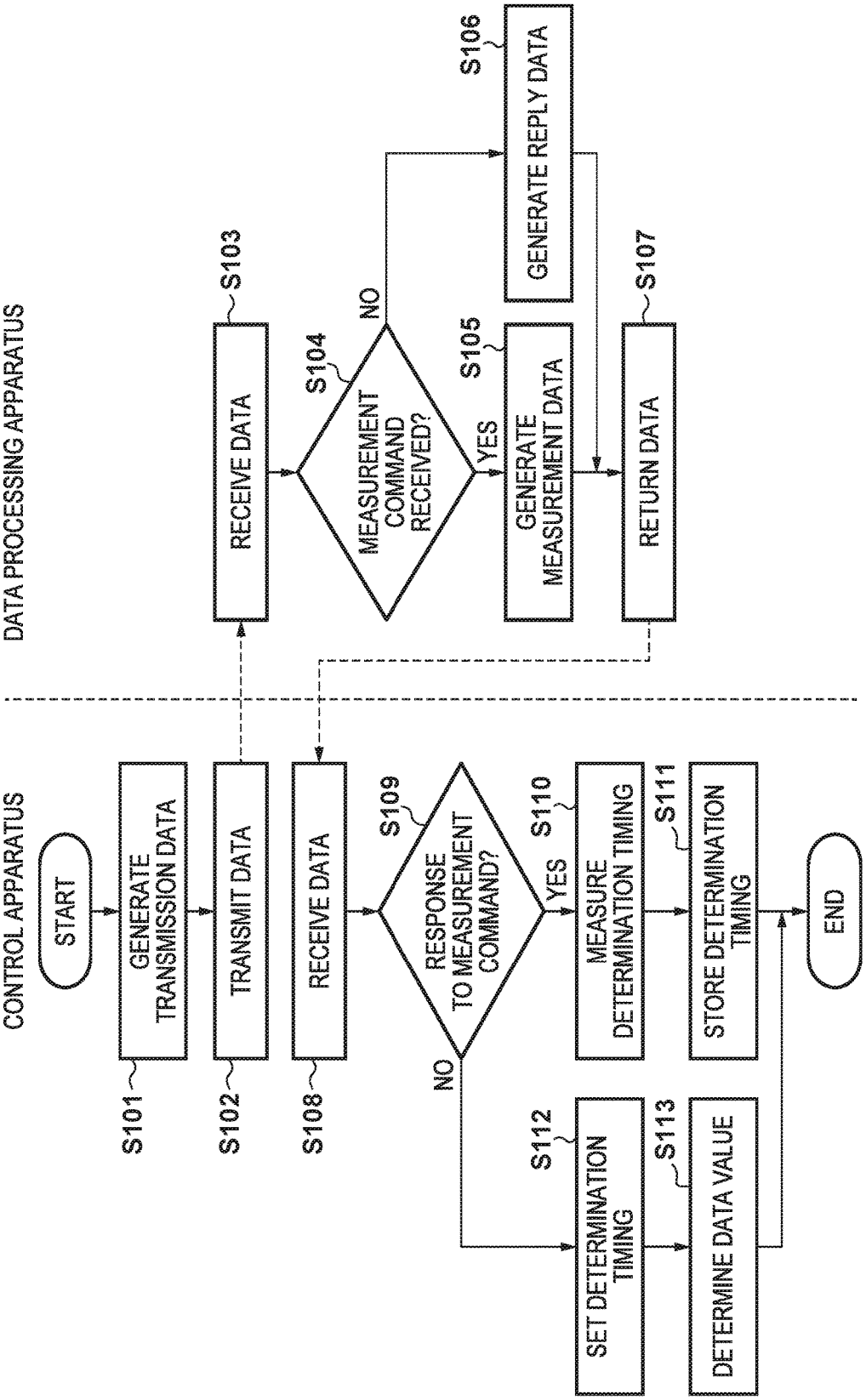
FIG. 18 is a flowchart illustrating data communication according to one embodiment.

FIG. 18 is a flowchart illustrating a data communication method according to the present embodiment. The control apparatus 1020 generates transmission data in S101, and transmits the transmission data to the data processing apparatus 1010 in S102. The data processing apparatus 1010 receives the data from the control apparatus 1020 in S103, and determines, in S104, whether the received data is a measurement command. If it is determined that the received data is a measurement command, the data processing apparatus 1010 generates measurement data in S105, and returns the measurement data to the control apparatus 1020 in S107. If, on the other hand, it is determined that the data received in S103 is not a measurement command, the data processing apparatus 1010 generates reply data in S106, and returns the reply data to the control apparatus 1020 in S107.

When the control apparatus 1020 receives the data from the data processing apparatus 1010 in S108, then, in S109, the control apparatus 1020 determines whether or not the received data is a response to the measurement command. If it is determined that the data is a response to the measurement command, the control apparatus 1020 measures the data value determination timing in S110, and causes the timing setting unit 1070 to store the result of measurement, or in other words, determination timing information that indicates the determination timing in S111. If, on the other hand, it is determined that the received data is not a response to the measurement command, then, in S112, the control apparatus 1020 informs the reception data generating unit 1060 of the determination timing information stored in the timing setting unit 1070. In S113, the reception data generating unit 1060 determines the data value of the reception data according to the determination timing.

As described above, by measuring the data value determination timing, it is unnecessary to provide a margin to the determination timing, and thus the data communication time can be shortened.

Fourth Embodiment

Next, a fourth embodiment will be described focusing on differences from the third embodiment. In the third embodiment, the control apparatus 1020 is configured to measure the determination timing based on the measurement data transmitted from the data processing apparatus 1010 during the period of the reply state that is a predetermined period. Also, the control apparatus 1020 is configured to inform the data processing apparatus 1010 of the predetermined period by transmitting the measurement command to the data processing apparatus 1010. In the present embodiment, instead of using the measurement command, the predetermined period during which the determination timing is measured is set to the processing state. During the period of the processing state, measurement may be performed only once, or may be performed a plurality of times. In the case where measurement is performed a plurality of times, the average value of the measurement results is used as the determination timing information. Hereinafter, a determination timing measurement method according to the present embodiment will be described with reference to FIG. 17.

Figure 17:
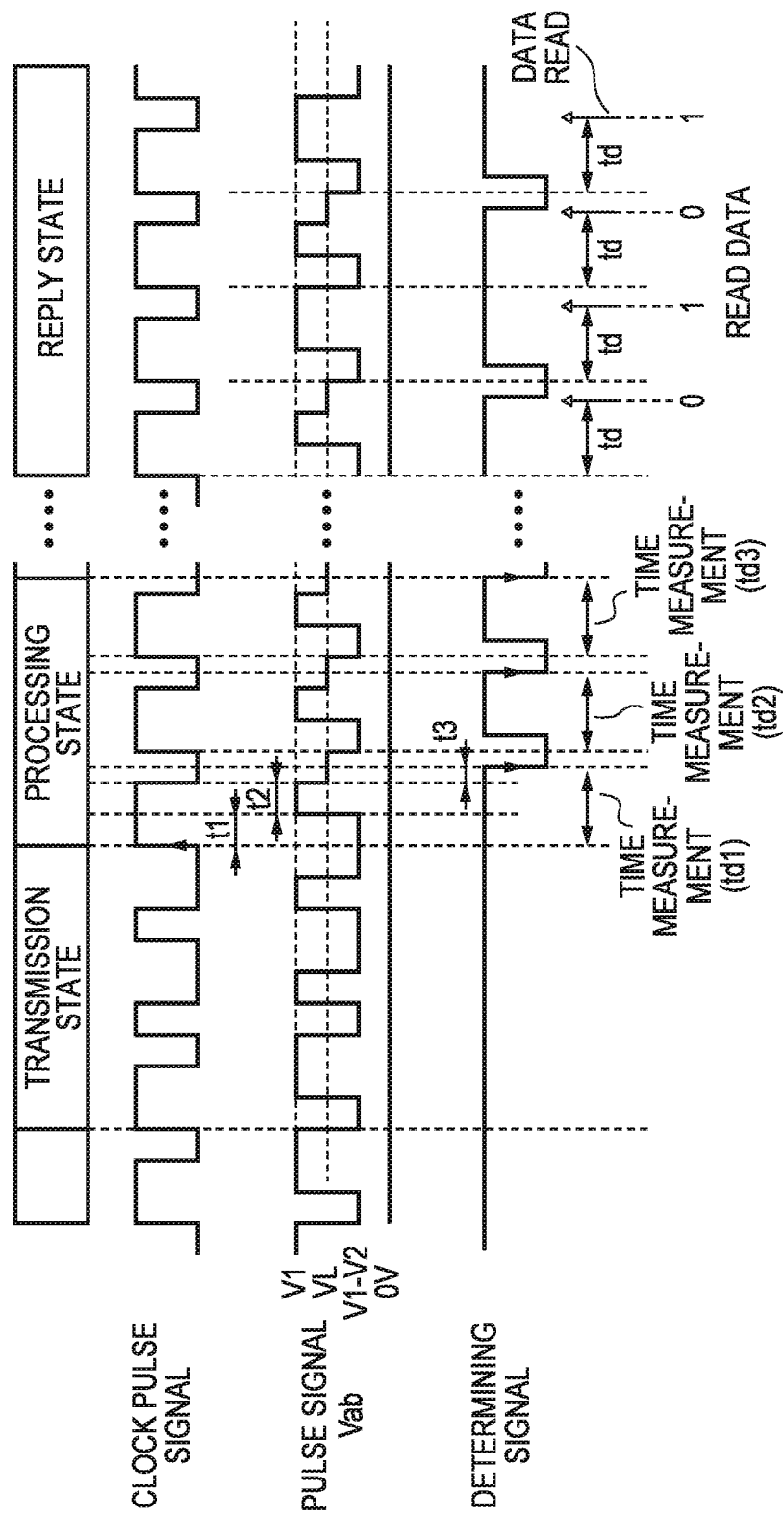
FIG. 17 is an illustrative diagram illustrating determination timing measurement according to one embodiment.

In the transmission state, the control apparatus 1020 transmits a data string for normal communication to the data processing apparatus 1010. After transition to the processing state, if the switching unit 1170 of the data processing apparatus 1010 detects a rising edge of each pulse of the pulse signal Vab from the control apparatus 1020, the switching unit 1170 increases the electric current I. Accordingly, the waveform of the pulse signal Vab and the determining signal output from the determining unit 1090 of the control apparatus 1020 are as shown in FIG. 17. After transition to the processing state, the timing measurement unit 1080 measures, for each pulse of the clock pulse signal, a length of time from a rising edge of the pulse to when the current determining signal is changed to a low level. For example, the timing measurement unit 1080 repeats the measurement during the processing state, and sets the average value td of the lengths of time obtained by the measurement in the timing setting unit 1070. The timing measurement unit 1080 may set the average value td directly in the reception data generating unit 1060. In FIG. 17, measurement values td1 to td3 are acquired by performing the measurement three times, and the average value obtained from the measurement values td1 to td3 is represented by td. It is unnecessary to perform the measurement on all pulses during the processing state, and a configuration is possible in which the measurement is performed with respect to one or more pulses that have been set in advance in the control apparatus 1020 and the data processing apparatus 1010.

Figure 19:
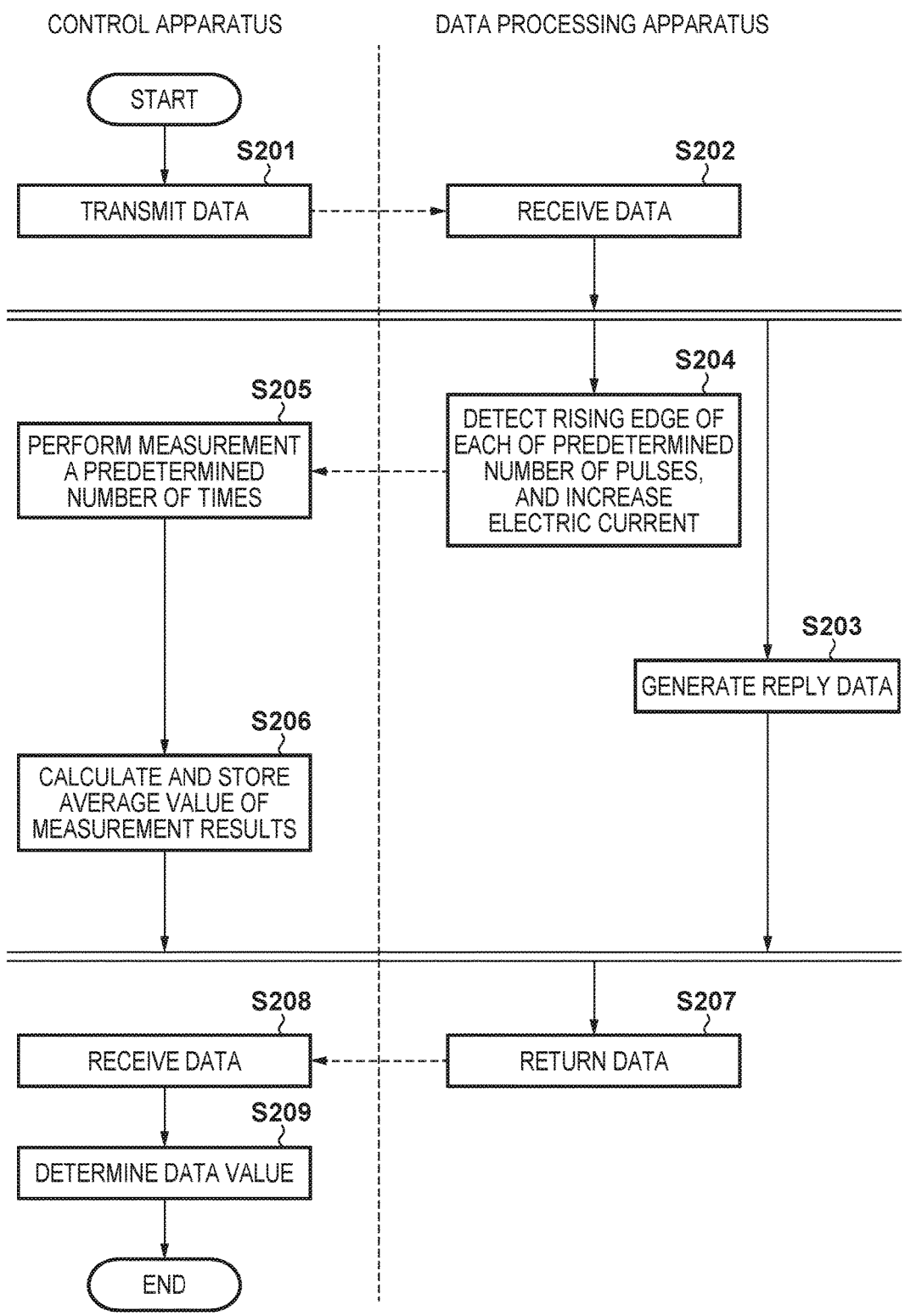
FIG. 19 is a flowchart illustrating data communication according to one embodiment.

FIG. 19 is a flowchart illustrating a data communication method according to the present embodiment. The control apparatus 1020 transmits data to the data processing apparatus 1010 in S201, and the data processing apparatus 1010 receives the data in S202. As a result, the state transitions to the processing state. After transition to the processing state, in S203, the data processing apparatus 1010 generates reply data. In parallel to the generation of reply data, in S204, the data processing apparatus 1010 detects a rising edge of each of a predetermined number of pulses of the pulse signal Vab, and increases the electric current I. The control apparatus 1020 performs determination timing measurement a predetermined number of times in S205, and sets the average value in the timing setting unit 1070 in S206. Here, the predetermined number mentioned in S204 and the predetermined number of times mentioned in S205 are the same value, and have been set in advance in the control apparatus 1020 and the data processing apparatus 1010. The measurement may be performed on all pulses during the processing state. Alternatively, the measurement may be performed on a predetermined number of pulses from the first pulse after transition has been made to the processing state. Still alternatively, the measurement may be performed on the n-th pulse to the m-th pulse after transition has been to the processing state. Here, n is an integer of 2 or more, and m is an integer that is greater than or equal to n.

After transition from the processing state to the reply state, in S207, the data processing apparatus 1010 transmits the reply data to the control apparatus 1020. In S208, the control apparatus 1020 receives the reply data, and in S209, determines the data value based on the determination timing set in the timing setting unit 1070.

As described above, in the present embodiment, the determination timing is measured during the processing state, it is unnecessary to use one cycle for determination timing measurement, and it is therefore possible to shorten the time required for data transmission and reception. A configuration is also possible in which, instead of constantly performing the determination timing measurement during the processing state, for example, the determination timing measurement is performed once every N transitions to the processing state.

Fifth Embodiment

Figure 20:
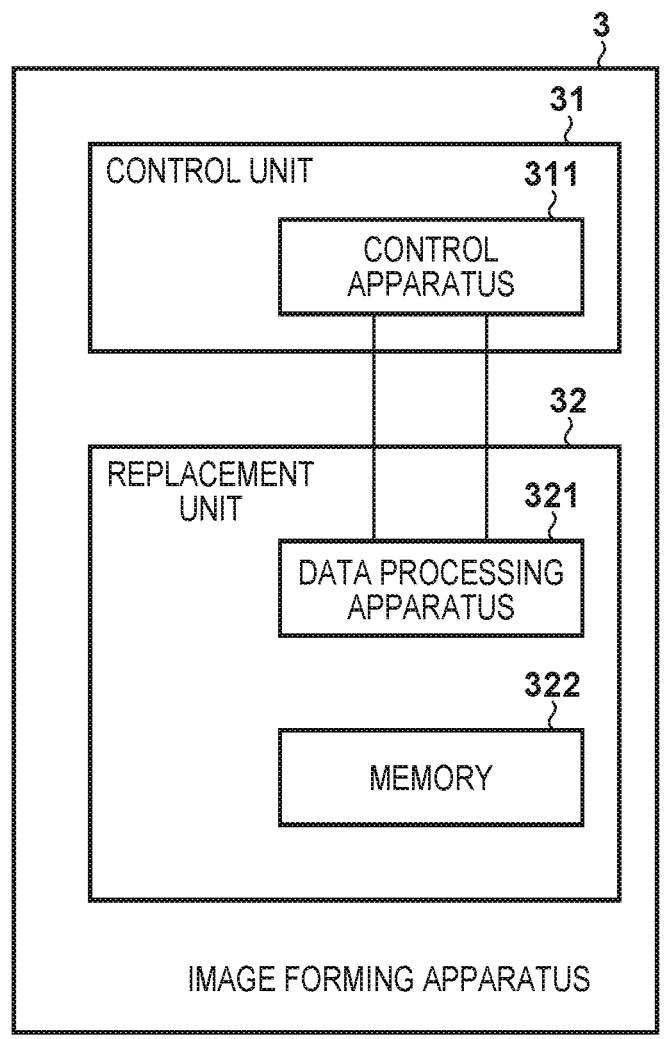
FIG. 20 is a configuration diagram of an image forming apparatus according to one embodiment.

Next, an image forming apparatus to which the data communication system according to any one of the first to fourth embodiments is applied will be described with reference to FIG. 20. An image forming apparatus 3 includes a control unit 31. Also, the image forming apparatus is configured such that a replacement unit 32 can be attached thereto. The replacement unit 32 is, for example, a toner cartridge that contains toner, and is configured to be attachable and detachable with respect to the image forming apparatus 3. The control unit 31 includes a control apparatus 311. The control apparatus 311 may be any one of the control apparatus 200 according to the first embodiment, the control apparatus 800 according to the second embodiment, and the control apparatus 1020 according to the third embodiment and the fourth embodiment. Also, the replacement unit 32 includes a data processing apparatus 321. The data processing apparatus 321 may be any one of the data processing apparatus 100 according to the first embodiment, the data processing apparatus 700 according to the second embodiment, and the data processing apparatus 1010 according to the third embodiment and the fourth embodiment. Also, the replacement unit 32 includes a memory 322 that is a storage, and unit information regarding the replacement unit 32 is stored in the memory 322. The memory 322 corresponds to the storage unit 107 according to the first embodiment or the second embodiment. On the other hand, in the third embodiment and the fourth embodiment, the data processing apparatus 1010 does not include an internal memory. In this case, the data processing apparatus 1010 is configured to be capable of making access to an external memory 322. The unit information includes, for example, the serial number of the replacement unit 32, identification information for identifying the replacement unit 32, and apparatus information for identifying the image forming apparatus 3 that can use the replacement unit 32. Furthermore, the unit information includes information regarding parameters for forming images to be used by the image forming apparatus 3 when the image forming apparatus 3 uses the replacement unit 32. Furthermore, in the case where the replacement unit 32 is, for example, a toner cartridge, component information includes information regarding the color of toner, and information regarding the amount of toner.

For example, if the replacement unit 32 is replaced, the control apparatus 311 of the control unit 31 transmits a command for reading out the unit information stored in the memory 322 to the data processing apparatus 321 during the transmission state. The data processing apparatus 321 reads out the unit information stored in the memory 322 and generates reply data during the processing state, and transmits the reply data to the control apparatus 311 during the reply state. The control unit 31 determines, based on the reply data, whether or not the replacement unit 32 is appropriate, controls the parameters for forming images when using the replacement unit 32, and determines the service life, the time for replacement, or the like of the replacement unit 32. The timing at which the control apparatus 311 and the data processing apparatus 321 perform communication is not limited to when the replacement unit 32 is replaced, and the control apparatus 311 and the data processing apparatus 321 can perform communication at any timing required by the control unit 31.

Other Embodiments

Embodiments of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-091396, filed on May 1, 2017 and Japanese Patent Application No. 2017-091397, filed on May 1, 2017, which are hereby incorporated by reference herein in their entirety.

What is claimed is:

1. A communication apparatus comprising:
a first terminal to which a reference voltage is input from an external apparatus;
a second terminal to which a pulse signal is input from the external apparatus; and
at least one processor to execute instructions, with the instructions being executed to operate as
a clock generating unit to generate a clock signal that has a frequency higher than a frequency of the pulse signal;
a counting unit to count a number of pulses of the clock signal and to determine a count value counted by the counting unit during a first cycle that is a cycle of the pulse signal to the second terminal; and
a transmitting unit to, during a period of data transmission to the external apparatus, increase or decrease an electric current that flows between the communication apparatus and the external apparatus via the first terminal according to a data value of data to be transmitted to the external apparatus,
wherein the transmitting unit further switches on the data to be transmitted to the external apparatus at least once during the first cycle, and determines a data switch timing during the first cycle based on the count value.

2. The communication apparatus according to claim 1, wherein the transmitting unit further transmits data to the external apparatus while the pulse signal is at either a high level or a low level during the period of data transmission to the external apparatus.

3. The communication apparatus according to claim 1, wherein the transmitting unit further determines that the data switch timing has come when the counting unit counts to a number obtained by dividing the count value by a predetermined integer.

4. The communication apparatus according to claim 1,
wherein the counting unit further determines the count value during a first period, and
the transmitting unit further determines the switch timing during a second period based on the count value, the second period being temporally subsequent to the first period.

5. The communication apparatus according to claim 4,
wherein the second period is a period that corresponds to the first cycle.

6. The communication apparatus according to claim 5,
wherein the first period is a period that corresponds to the first cycle and that is temporally prior to the second period by an amount corresponding to the first cycle.

7. The communication apparatus according to claim 4,
wherein the first period is a period that is included during a time from when the external apparatus starts transmitting data to the communication apparatus to when the communication apparatus starts transmitting data to the external apparatus.

8. The communication apparatus according to claim 1,
wherein the external apparatus changes a duty ratio of the pulse signal according to the data value during a period of data transmission from the external apparatus to the communication apparatus, and
the instructions are executed to operate as a determining unit to, during the period of data transmission from the external apparatus to the communication apparatus, determine the data value transmitted from the external apparatus by determining the duty ratio of the pulse signal based on the clock signal.

9. The communication apparatus according to claim 1,
wherein the instructions are executed to operate as an operating voltage generating unit to generate an operating voltage based on a voltage difference between the first terminal and the second terminal.

10. A communication apparatus comprising:
a first terminal that outputs a reference voltage to an external apparatus;
at least one processor to executes instructions, with the instructions being executed to operate as a generating unit to generate a pulse signal; and
a second terminal that outputs the pulse signal generated by the generating unit to the external apparatus,
wherein the instructions are further executed to operate as a determining unit to determine a data value of data transmitted from the external apparatus by comparing an electric current that flows between the communication apparatus and the external apparatus via the first terminal with a threshold value during a period of data transmission from the external apparatus,
wherein the generating unit further generates a pulse signal of a first cycle during the period of data transmission from the external apparatus, and
the determining unit further determines a determination timing of determining the data value of the data transmitted from the external apparatus during the period of data transmission from the external apparatus based on a period obtained by dividing the first cycle by a predetermined integer.

11. The communication apparatus according to claim 10,
wherein the determining unit further determines the data value while the pulse signal is at either a high level or a low level during the period of data transmission from the external apparatus.

12. The communication apparatus according to claim 10,
wherein the generating unit further sets the first cycle to an integer multiple of a cycle of a pulse signal that is generated during a period that is different from the period of data transmission from the external apparatus.

13. The communication apparatus according to claim 10,
wherein the generating unit further controls, during a period of data transmission to the external apparatus, a duty ratio of the pulse signal generated according to the data value to be transmitted to the external apparatus.

14. A communication apparatus comprising:
at least one processor to execute instructions, with the instructions being executed to operate as
a first generating unit to generate a first pulse signal; and
a second generating unit to generate a second pulse signal based on the first pulse signal;
a first terminal for outputting the second pulse signal to an external apparatus; and
a second terminal for outputting a reference voltage to the external apparatus,
wherein the instructions are further executed to operate as
a storing unit to store determination timing information that indicates a determination timing of determining a data value received from the external apparatus by using a relative time relative to the first pulse signal;
a determining unit to determine the data value received from the external apparatus based on an electric current that flows to the external apparatus via the second terminal at the determination timing indicated by the determination timing information; and
a measurement unit to measure the determination timing and cause the storing unit to store the determination timing information.

15. The communication apparatus according to claim 14,
wherein the measurement unit further measures the determination timing by measuring a length of time from an edge of the first pulse signal to when there is a change in the electric current that flows to the external apparatus via the second terminal.

16. The communication apparatus according to claim 14,
wherein the measurement unit further measures the determination timing by measuring a length of time from a predetermined pulse edge of the first pulse signal during a predetermined period to when there is a change in the electric current that flows to the external apparatus via the second terminal.

17. The communication apparatus according to claim 16,
wherein the measurement unit further measures the determination timing by measuring a length of time from a predetermined pulse edge of the first pulse signal during the predetermined period to when the electric current that flows to the external apparatus via the second terminal is changed to be greater than a threshold value.

18. The communication apparatus according to claim 16,
wherein the first generating unit further changes a duty ratio of the first pulse signal according to a data value of data to be transmitted to the external apparatus, and inform, the external apparatus of the predetermined period.

19. The communication apparatus according to claim 16,
wherein the predetermined period is a period from when data is transmitted to the external apparatus to when a response to the data is received from the external apparatus.

20. The communication apparatus according to claim 14, wherein the second generating unit further generates the second pulse signal by converting a level of the first pulse signal.

21. A communication apparatus comprising:
at least one processor to execute instructions, with the instructions being executed to operate as
a generating unit to generate a pulse signal;
a first terminal that outputs the pulse signal to an external apparatus; and
a second terminal that outputs a reference voltage to the external apparatus,
wherein the instructions are further executed to operate as
a storing unit to store determination timing information that indicates a determination timing of determining a data value received from the external apparatus by using a relative time relative to the pulse signal;
a determining unit to determine the data value received from the external apparatus based on an electric current that flows to the external apparatus via the second terminal at the determination timing indicated by the determination timing information; and
a measurement unit to measure the determination timing and cause the storing unit to store the determination timing information.

22. A communication apparatus comprising:
a first terminal to which a pulse signal is input from an external apparatus;
a second terminal to which a reference voltage is input from the external apparatus; and
at least one processor to execute instructions, with the instructions being executed to operate as
a transmitting unit to, if an edge of the pulse signal is detected when transmitting data to the external apparatus, control an electric current that flows between the communication apparatus and the external apparatus via the second terminal according to a data value to be transmitted to the external apparatus,
wherein the transmitting unit further changes the electric current that flows between the communication apparatus and the external apparatus via the second terminal if a predetermined pulse edge of the pulse signal is detected during a predetermined period.

23. The communication apparatus according to claim 22, wherein the transmitting unit changes the electric current that flows between the communication apparatus and the external apparatus via the second terminal to be greater than a threshold value if a predetermined pulse edge of the pulse signal is detected during the predetermined period.

24. The communication apparatus according to claim 22, wherein the predetermined period is informed from the external apparatus.

25. The communication apparatus according to claim 22, wherein the predetermined period is a period from when data is received from the external apparatus to when data is transmitted to the external apparatus.

26. A replacement unit that is attachable and detachable with respect to an image forming apparatus, and includes a communication apparatus,
the communication apparatus comprising:
a first terminal to which a reference voltage is input from the image forming apparatus;
a second terminal to which a pulse signal is input from the image forming apparatus; and
at least one processor to execute instructions, with the instructions being executed to operate as
a clock generating unit to generate a clock signal that has a frequency higher than a frequency of the pulse signal;
a counting unit to count a number of pulses of the clock signal and to determine a count value counted by the counting unit during a first cycle that is a cycle of the pulse signal input to the second terminal; and
a transmitting unit to, during a period of data transmission to the image forming apparatus, increase or decrease an electric current that flows between the communication apparatus and the image forming apparatus via the first terminal according to a data value of data to be transmitted to the image forming apparatus,
wherein the transmitting unit further performs switching on the data to be transmitted to the image forming apparatus at least once during the first cycle, and determines a data switch timing during the first cycle based on the count value.

27. A replacement unit that is attachable and detachable with respect to an image forming apparatus, and includes a communication apparatus,
the communication apparatus comprising:
a first terminal to which a pulse signal is input from the image forming apparatus;
a second terminal to which a reference voltage is input from the image forming apparatus; and
at least one processor to execute instructions, with the instructions being executed to operate as
a transmitting unit to, if an edge of the pulse signal is detected when transmitting data to the image forming apparatus, control an electric current that flows between the communication apparatus and the image forming apparatus via the second terminal according to a data value of data to be transmitted to the image forming apparatus,
wherein the transmitting unit further changes the electric current that flows between the communication apparatus and the image forming apparatus via the second terminal if a predetermined pulse edge of the pulse signal is detected during a predetermined period.

28. An image forming apparatus to which a replacement unit can be attached, the image forming apparatus comprising:
a first terminal that outputs a reference voltage to the replacement unit;
at least one processor to execute instructions, with the instructions being executed to operate as
a generating unit to generate a pulse signal; and
a second terminal that outputs the pulse signal generated by the generating unit to the replacement unit;
wherein the instructions are further executed to operate as
a determining unit configured to, during a period of data transmission from the replacement unit, determine a data value of data transmitted from the replacement unit by comparing an electric current that flows between the image forming apparatus and the replacement unit via the first terminal with a threshold value,
wherein the generating unit further generates a pulse signal of a first cycle during the period of data transmission from the replacement unit, and
the determining unit further determines a determination timing of determining the data value of data transmitted from the replacement unit during the period of data transmission from the replacement unit based on a period obtained by dividing the first cycle by a predetermined integer.

29. An image forming apparatus to which a replacement unit can be attached, the image forming apparatus comprising:
- at least one processor to execute instructions, with the instructions being executed to operate as
- a first generating unit to generate a first pulse signal; and
- a second generating unit to generate a second pulse signal based on the first pulse signal;
- a first terminal for outputting the second pulse signal to the replacement unit; and
- a second terminal for outputting a reference voltage to the replacement unit,
- wherein the instructions are further executed to operate as a storing unit to store determination timing information that indicates a determination timing of determining a data value received from the external apparatus by using a relative time relative to the first pulse signal,
- a determining unit to determine the data value received from the replacement unit based on an electric current that flows to the replacement unit via the second terminal at the determination timing indicated by the determination timing information, and
- a measurement unit to measure the determination timing and cause the storing unit to store the determination timing information.

* * * * *